(12) United States Patent
Deng et al.

(10) Patent No.: US 7,924,640 B2
(45) Date of Patent: Apr. 12, 2011

(54) METHOD FOR MEMORY CELL CHARACTERIZATION USING UNIVERSAL STRUCTURE

(75) Inventors: Xiaowei Deng, Plano, TX (US); Wah Kit Loh, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 619 days.

(21) Appl. No.: 11/945,469

(22) Filed: Nov. 27, 2007

(65) Prior Publication Data

US 2008/0148116 A1 Jun. 19, 2008

Related U.S. Application Data

(60) Provisional application No. 60/874,768, filed on Dec. 14, 2006.

(51) Int. Cl.
*G11C 29/00* (2006.01)
(52) U.S. Cl. ......................... 365/201; 365/154; 365/156
(58) Field of Classification Search .................. 365/201, 365/154, 156
See application file for complete search history.

(56) References Cited

U.S. PATENT DOCUMENTS

| | | | | |
|---|---|---|---|---|
| 5,428,574 A | * | 6/1995 | Kuo et al. ...................... | 365/201 |
| 2006/0097802 A1 | * | 5/2006 | Chan et al. ...................... | 331/57 |
| 2007/0035985 A1 | * | 2/2007 | Fifield et al. ................... | 365/154 |
| 2008/0062746 A1 | * | 3/2008 | Loh et al. ....................... | 365/154 |
| 2008/0144421 A1 | | 6/2008 | Deng | |

* cited by examiner

*Primary Examiner* — Son Dinh
*Assistant Examiner* — Toan Le
(74) *Attorney, Agent, or Firm* — Wade J. Brady, III; Frederick J. Telecky, Jr.

(57) ABSTRACT

A test method includes providing an integrated circuit, where the integrated circuit includes a memory base cell, where the memory base cell includes a first storage node set, a second storage node set, a set of other nodes, and a set of circuit elements each having a plurality of terminals, where the set of other nodes includes a first data node for accessing the first storage node set, a first access control node for controlling the access of the first storage node set, a first supply node for supplying the first storage node set, and a second supply node for supplying the second storage node set, where the first and second supply nodes are of the same sinking or sourcing type. The method further includes conducting a circuit element test on a circuit element in the set of circuit elements, where in the circuit element test the first and second supply nodes are not connected together, each terminal of the circuit element is directly forced with an electrical quantity, and an electrical quantity is directly measured from a terminal of the circuit element. Further, the method includes conducting at least one of a static noise margin test or a full cell test on the memory base cell.

22 Claims, 24 Drawing Sheets

| | BL0 | BL1 | BL2 | BL3 | ... | BLN |
|---|---|---|---|---|---|---|
| WLM | MEMORY CELL | MEMORY CELL | MEMORY CELL | MEMORY CELL | ... | MEMORY CELL |
| ⋮ | ⋮ | ⋮ | ⋮ | ⋮ | ... | ⋮ |
| WL3 | MEMORY CELL | MEMORY CELL | MEMORY CELL | MEMORY CELL | ... | MEMORY CELL |
| WL2 | MEMORY CELL | MEMORY CELL | MEMORY CELL | MEMORY CELL | ... | MEMORY CELL |
| WL1 | MEMORY CELL | MEMORY CELL | MEMORY CELL | MEMORY CELL | ... | MEMORY CELL |
| WL0 | MEMORY CELL | MEMORY CELL | MEMORY CELL | MEMORY CELL | ... | MEMORY CELL |

US 7,924,640 B2

METHOD FOR MEMORY CELL CHARACTERIZATION USING UNIVERSAL STRUCTURE

REFERENCE TO RELATED APPLICATIONS

This application claims priority to Ser. No. 60/874,768 filed Dec. 14, 2006, which is entitled "Universal Structure for Memory Cell Characterization."

FIELD OF INVENTION

The present invention relates to integrated circuits and more particularly to structures and test methods for characterizing memory cells in integrated circuits.

BACKGROUND OF THE INVENTION

Memory cells are frequently used in integrated circuits. They often take a large fraction of integrated circuit area. Consequently, significant amount of effort is usually spent to minimize the area of a memory cell while meeting the required performance and yield targets of the memory cell. Typically, this involves not only the memory cell development but also the integrated circuit process development, since the area, performance, and yield of the memory cell strongly depend on the capability and variation of the integrated circuit process.

Memory cell characterization provides critical feedbacks regarding the health of the memory cell and associated integrated circuit process. It is essential for the development of memory cells in integrated circuits as well as for the development and monitoring of the integrated circuit process supporting the memory cells. A correct characterization of a memory cell is also essential for the optimum design of an integrated circuit comprising the memory cell.

A relatively complete characterization of a memory cell requires measuring a plurality of characteristics of (a) the memory cell and (b) the circuit elements of the memory cell. For example, a relatively complete characterization of a standard 6T static random access memory (SRAM) cell may require measuring more than ten characteristics including minimum write voltage, minimum and maximum read voltages, minimum data-retention voltage, read currents, trip voltages, active and standby static noise margins, and characteristics of each of the six transistors. As local variation becomes increasingly important with scaling, there will be asymmetry in nominally symmetric memory cells; therefore, each of the characteristics must be characterized for each state of the cell (store '1' and store '0').

Currently, a relatively complete characterization of a memory cell depends on several test structures, each for measuring one or a subset of the required plurality of characteristics. For example, a relatively complete characterization of a standard 6T SRAM cell may depend on nine different test structures including (a) a full-cell test structure for measuring minimum write voltage, minimum and maximum read voltages, minimum data-retention voltage, read currents, and trip voltages, (b) two half-cell test structures for measuring active and standby static noise margins, and (c) six transistor test structures for measuring the characteristics of the six transistors.

With current technologies, two similar transistors even in similar environments will have different characteristics due to random variation. Thus the use of different test structures to characterize the various characteristics of (a) a memory cell and (b) the circuit elements of the memory cell has inherent deficiencies. The characteristics measured in different test structures can not be correlated because of local random variation. Also, the local mismatch information of the circuit elements of the memory cell cannot be obtained.

Therefore, the current approach to memory cell characterization limits the usefulness of the measurements for memory cell development and for integrated circuit process development and monitoring.

SUMMARY OF THE INVENTION

To address the above deficiencies in the art for memory cell characterization, it is an object of the present invention to provide a universal test structure (UTS) and an associated test method such that all characteristics required for a relatively complete characterization of a memory cell in an integrated circuit can be accurately measured from a same memory base cell. It is an advantage of the present invention to allow direct correlation among all the characteristics measured for a relatively complete characterization of memory cell. It is a further advantage of the present invention to allow collection of all the local mismatch data for a relatively complete characterization of a memory cell. It is a purpose of this invention to improve the usefulness of the measurements for memory cell development as well as for associated integrated circuit process and design development, monitoring, and control.

These and other objects, purposes, and advantages are provided in a test method comprising (a) providing an integrated circuit, wherein the integrated circuit comprises a memory base cell, wherein the memory base cell comprises a first storage node set, a second storage node set, a set of other nodes, and a set of circuit elements each having a plurality of terminals, wherein the set of other nodes comprises a first data node for accessing the first storage node set. The integrated circuit further comprises a first access control node for controlling the access of the first storage node set, a first supply node for supplying the first storage node set, and a second supply node for supplying the second storage node set, wherein the first and second supply nodes are of the same sinking or sourcing type. The method further comprises (b) conducting a circuit element test on a circuit element in the set of circuit elements, where in the circuit element test the first and second supply nodes are not connected together, each terminal of the circuit element is directly forced with an electrical quantity, and an electrical quantity is directly measured from a terminal of the circuit element, and (c) conducting at least one of a static noise margin test and a full cell test on the memory base cell.

In another aspect of the present invention, a test method is disclosed. The test method comprises (a) providing an integrated circuit, wherein the integrated circuit comprises a memory base cell, wherein the memory base cell comprises a first storage node set, a set of other nodes, and a plurality of circuit elements each having a plurality of terminals, wherein the first storage node set is the only storage node set in the memory base cell, wherein the set of other nodes comprises a first data node for accessing the first storage node set, a first access control node for controlling the access of the first storage node set, and a reference node for the first storage node set. The method further comprises (b) conducting a circuit element test on each circuit element in the set of circuit elements, each terminal of the each circuit element is directly forced with an electrical quantity, and an electrical quantity is directly measured from a terminal of the each circuit element.

DETAILED DESCRIPTION OF THE INVENTION

Figure 1A:
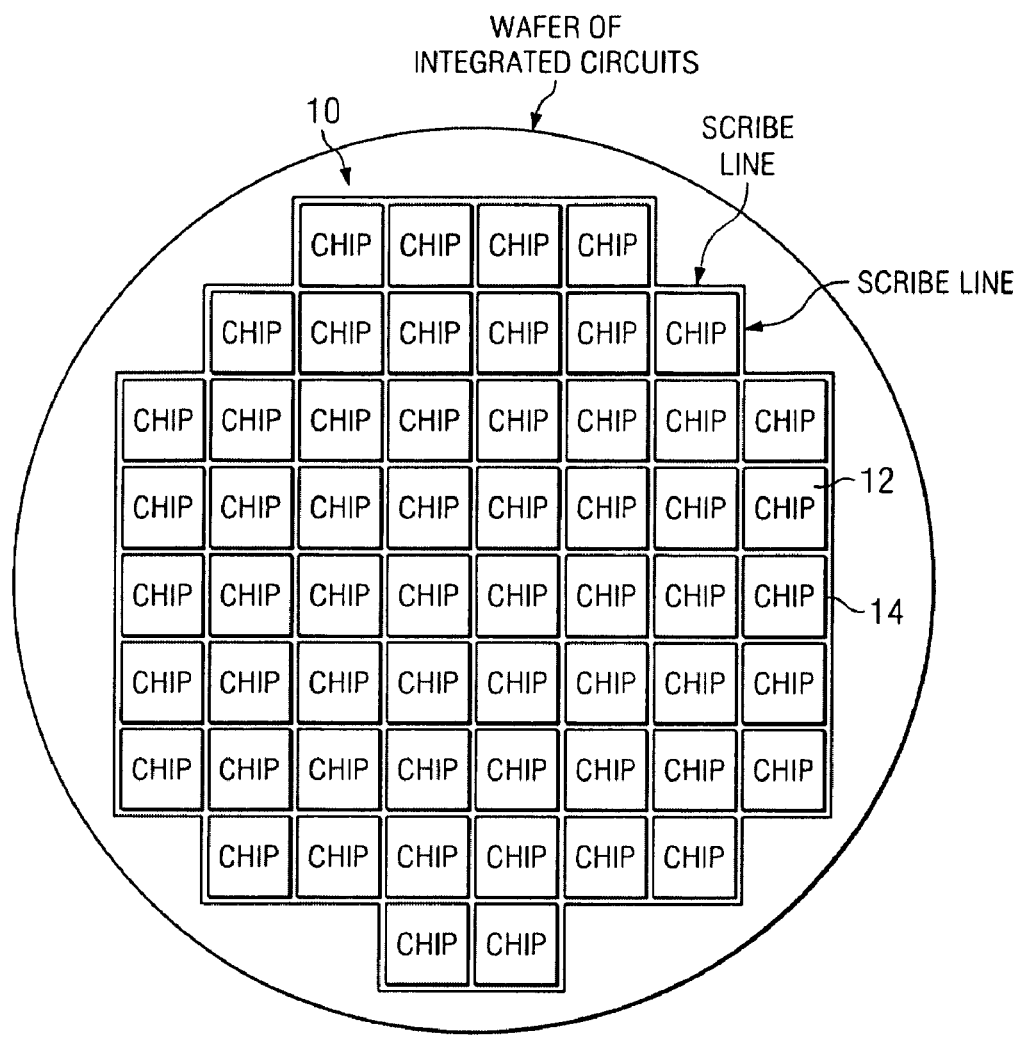
FIG. 1A is a diagram illustrating the relationship among an integrated circuit, a chip, and a scribe line.

FIG. 1A is a diagram illustrating the relationship among an integrated circuit 10, a chip 12, and a scribe line 14.

The term "integrated circuit" used here includes both chip and scribe line regions. In particular, it includes test structures that are in a chip or in a scribe line.

The term "scribe line" refers to the region surrounding a chip and between chips where a saw can pass when sawing chips apart. Typically, some test structures are placed in a scribe line for characterizing circuits in a chip and for monitoring and control of the integrated circuit process.

Figure 1B:
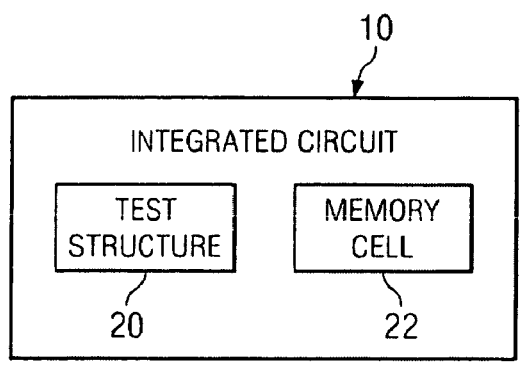
FIG. 1B is a diagram illustrating the relationship among an integrated circuit, a test structure, and a memory cell the test structure characterizes.

FIG. 1B is a diagram illustrating the relationship among an integrated circuit 10, a test structure 20, and a memory cell 22 the test structure characterizes. In general, a test structure 20 and a circuit (such as the memory cell 22) the test structure characterizes can be independently placed in any regions of an integrated circuit 10.

Figures 1C, 2A:
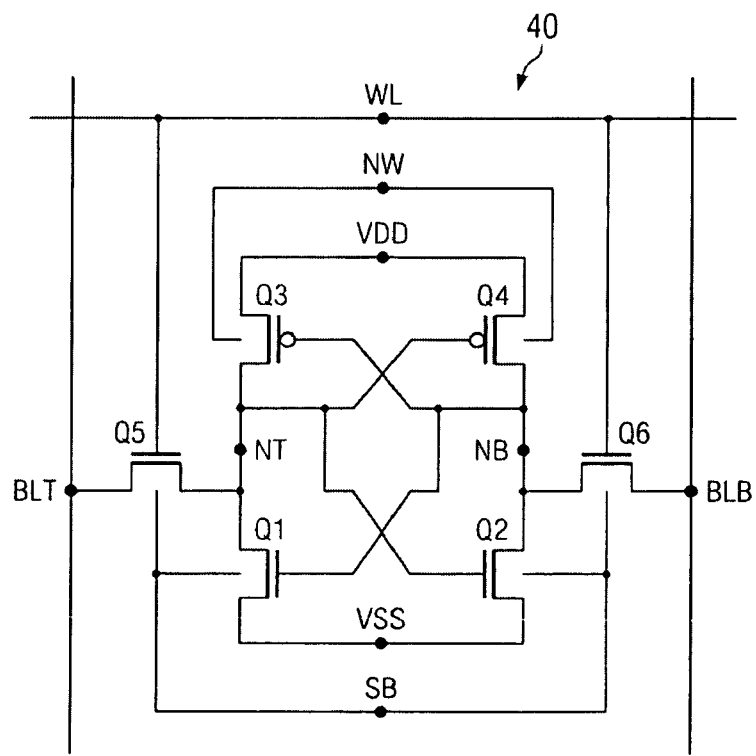
FIG. 1C is a diagram illustrating a plurality of memory cells configured as a memory array.
FIG. 2A is a schematic diagram illustrating a standard 6T SRAM cell.

FIG. 1C is a diagram illustrating a plurality of memory cells 22 configured as a memory array 30.

The term "memory cell" used here refers to a compact memory cell suitable for forming a memory array and operable to maintain one of at least a first state and a second state. Characteristics of a memory cell include that the cell can be tiled compactly, abutting each other, in an array such that individual cells can be accessed in the array, generally by the cross point of a word line (WL) and a bit line (BL). The tiling of the memory cell may include a plurality of orientations of the memory cell. The tiling may also include a plurality of variations of the memory cell.

The area of a memory cell 22 is approximately the minimum for the sizes of the memory cell circuit elements compatible with forming an approximately minimum area array supportable by the technology with acceptable yield. In particular, the circuit elements of a memory cell are not spaced apart further than otherwise necessary for manufacturability, whereas circuit elements in some test structures might be spaced apart for the purpose of enabling characterization of the components. The sizes of the circuit elements in a memory cell are generally determined by performance requirements, not necessarily minimum area.

The term "memory array" used here refers to an array 30 of memory cells tiled or configured as described above.

FIG. 2A is a schematic diagram illustrating a standard 6T SRAM cell 40. The standard 6T SRAM cell has six transistors including two nMOS driver transistors Q1 and Q2, two pMOS load transistors Q3 and Q4, and two nMOS pass transistors Q5 and Q6. Each transistor has four terminals, i.e., drain, gate, source, and body terminals as indicated by the standard transistor symbol. The SRAM cell has nine nodes including two storage nodes NT and NB (T stands for true; B stand for bar or complementary), two data nodes (or bit line nodes in this case) BLT and BLB, an access control node (or word line node in this case) WL, a sinking supply node VSS, a sourcing supply node VDD, a substrate node SB connected to the nMOS body terminals, and an n-well node NW connected to the pMOS body terminals.

A "node" is not connected to another node, particularly of a different name, unless otherwise explicitly stated.

The term "connected" used herein refers to connected directly through electrically conductive layers, including substrate and nwell, without passing through any circuit element such as transistors.

The term "connection" used herein refers to direct connection through electrically conductive layers, including substrate and nwell, without passing through any circuit element such as transistors.

The term "storage node" used herein refers to a node where the state of a memory cell is maintained. Typical SRAM cells have two complementary storage nodes where one storage node will be high and the other low, depending on the state being stored.

The term "data node" used herein refers to a node for accessing (supplying or retrieving data to or from) a memory cell. In a standard 6T SRAM cell, the data node is generally referred to as a bit-line (BL) node.

The term "access control node" used herein refers to a node for controlling (enabling or disabling) the access of a storage node (from or to a data node) in a memory cell. In a standard 6T SRAM cell, the access control node is generally referred to as a word line (WL) node.

The term "supply node" used herein refers to a node where the power or ground for maintaining the state of a storage node is supplied.

The term "sinking supply node" used herein refers to a supply node where the current flows out of a memory cell during the storage mode (such as standby mode and data retention mode) of memory cell operation.

The term "sourcing supply node" used herein refers to a supply node where the current flows into a memory cell during the storage mode of memory cell operation.

In a floating body SOI technology, however, SB and NW nodes in FIG. 2A do not exist because the body of a transistor is hidden in the transistor.

Figure 2B:
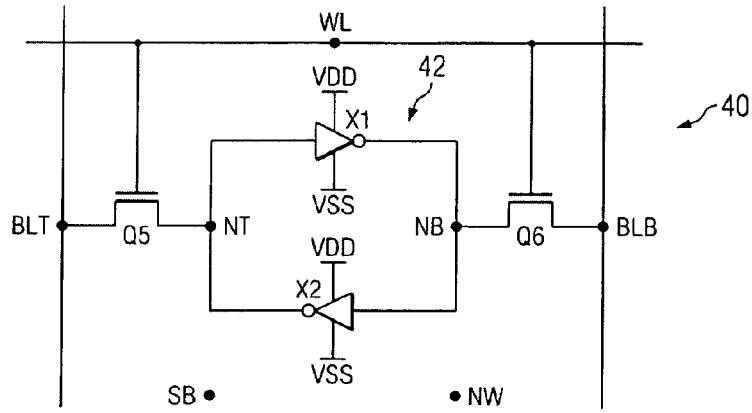
FIG. 2B is a simplified schematic diagram of the standard 6T SRAM cell of FIG. 2A, with the core circuit represented as a pair of cross-coupled inverters.

FIG. 2B is a simplified schematic diagram of the standard 6T SRAM cell 40 of FIG. 2A, with the core circuit 42 represented as a pair of cross-coupled inverters X1 and X2. Transistors Q2 and Q4 in FIG. 2A form inverter X1 while transistors Q1 and Q3 in FIG. 2A form inverter X2. During storage mode of SRAM cell operation, the state of the SRAM cell is maintained by the two cross-coupled inverters.

For simplicity, a "connecting-by-name" scheme is used in this schematic diagram where a connection between two portions of a node (such as VDD) is not explicitly drawn but instead implied by labeling both portions with a same node name.

Also for simplicity, the connections from body terminals of transistors to body nodes such as SB and NW are not explicitly shown in this schematic diagram. For the same reason, they might not be explicitly shown in some of the subsequent drawings.

The term "inverter" used here refers generally to a circuit where the output logic level is the complementary or inverse of input logic level during the storage mode of memory cell operation.

Figure 2C:
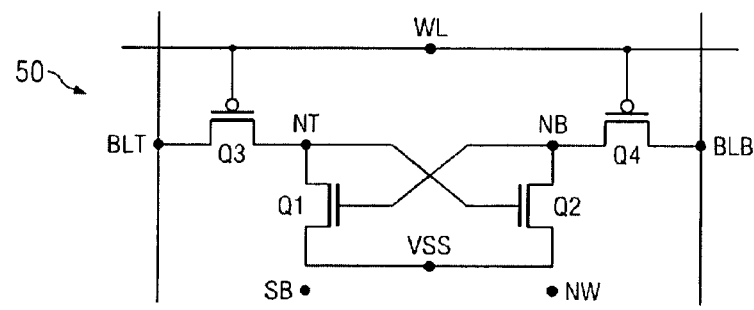
FIG. 2C is a schematic diagram of a load-less 4T SRAM cell, illustrating another example of inverter configuration.

FIG. 2C is a schematic diagram of a load-less 4T SRAM cell 50, illustrating another example of an inverter configuration. Driver transistor Q1 and pass gate transistor Q3 form a first inverter while driver transistor Q2 and pass gate transistor Q4 form a second inverter, since Q3 and Q4 serve as load transistors during the storage mode of memory cell operation (when BLT and BLB are at a pre-charged high voltage level).

FIG. 2C also illustrates the possibility of an SRAM cell having only one type of sinking or sourcing supply node, such as a sinking supply node VSS in this case.

Figure 2D:
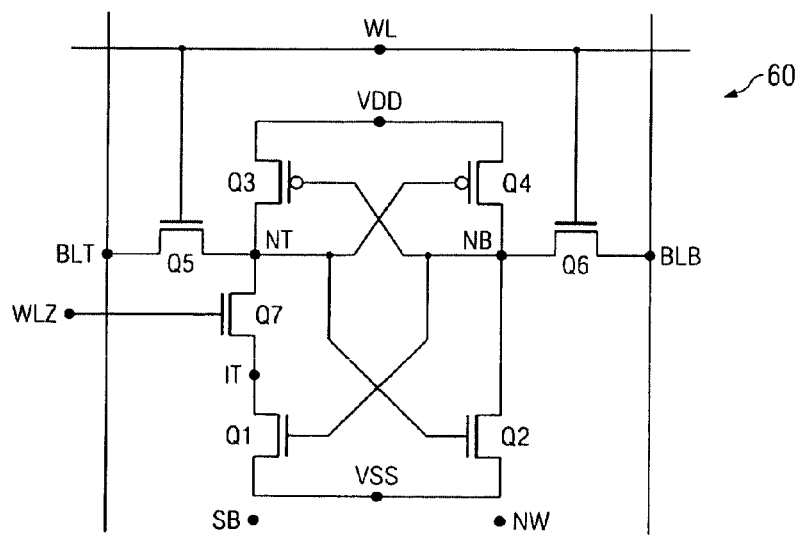
FIG. 2D is a schematic diagram of a 7T asymmetric SRAM cell, illustrating yet another example of inverter configuration.

FIG. 2D is a schematic diagram of a 7T asymmetric SRAM cell 60, illustrating yet another example of an inverter configuration. Driver transistor Q1, isolation transistor Q7, and load transistor Q3 form a first inverter while driver transistor Q2 and load transistor Q4 form a second inverter, as the isolation transistor Q7 is kept on during the storage mode of memory cell operation.

Figure 3A:
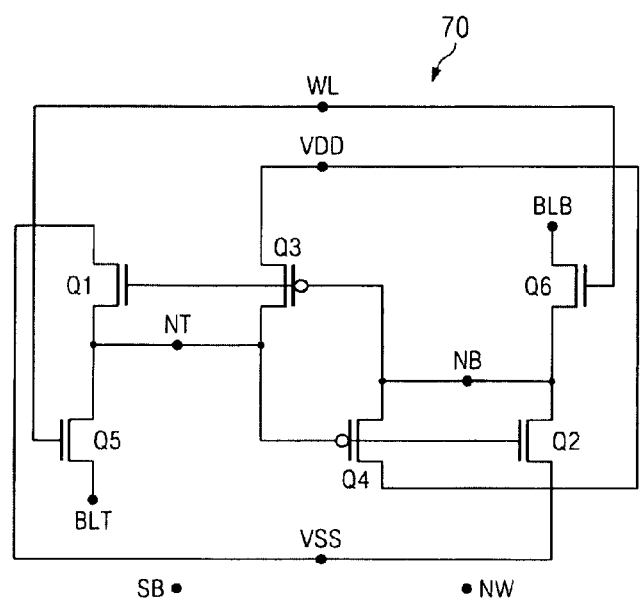
FIG. 3A is a schematic diagram of the standard 6T SRAM cell, identical to FIG. 2A except that the circuit elements are positioned in the same relationship as in a small aspect ratio (SAR) layout configuration.

FIG. 3A is a schematic diagram of the standard 6T SRAM cell 70, identical to FIG. 2A except that the circuit elements are positioned in the same relationship as in small aspect ratio (SAR) layout configuration. It helps to understand the layout to be described below.

Figure 3B:
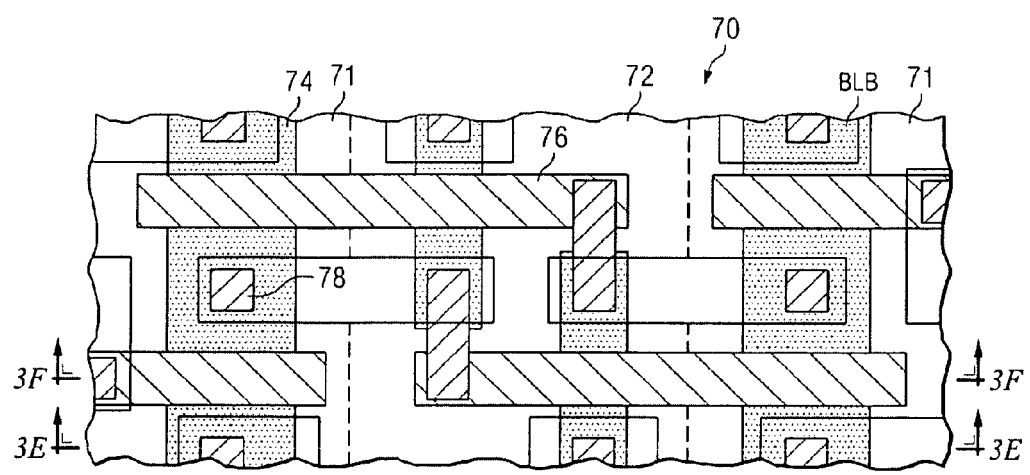
FIG. 3B illustrates the layouts of NWELL, MOAT, GATE, CONTACT, and METAL1 layers of the standard 6T SRAM cell in SAR configuration.
Figure 3C:
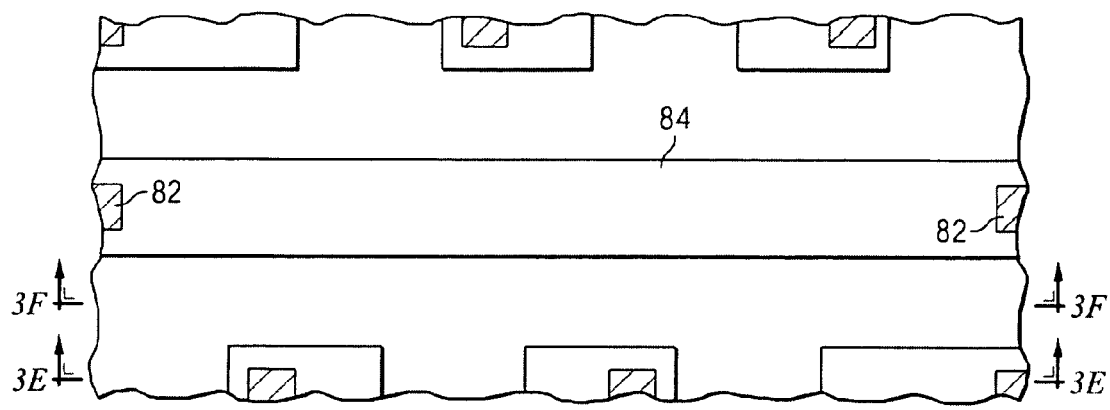
FIG. 3C illustrates the layouts of VIA1 and METAL2 layers of the standard 6T SRAM cell in SAR configuration.
Figure 3D:
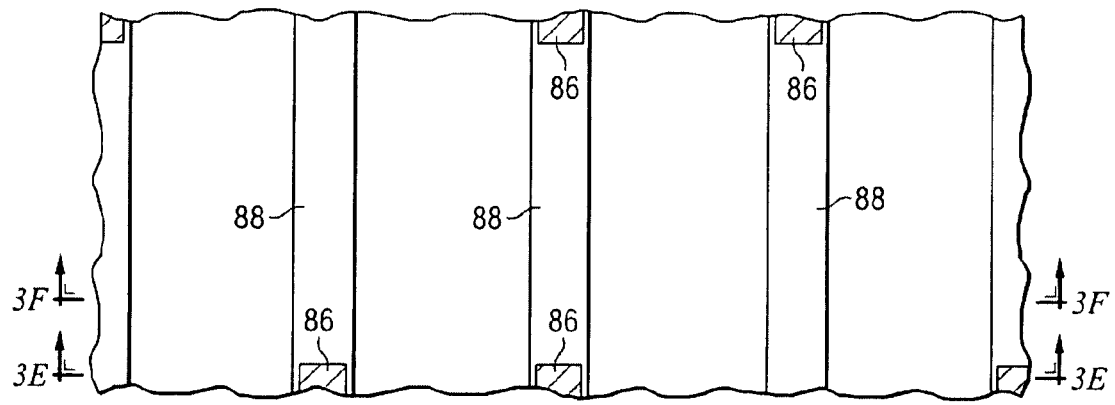
FIG. 3D illustrates the layouts of VIA2 and METAL3 layers of the standard 6T SRAM cell in SAR configuration.

FIGS. 3B, 3C and 3D illustrate a layout of the standard 6T SRAM cell in SAR configuration, which is the typical layout configuration currently used for SRAM cells. FIGS. 3B, 3C, and 3D should be viewed as overlaying on top of each other. FIG. 3B illustrates the layouts of NWELL 72, MOAT 74, GATE 76, CONTACT 78, and METAL1 80 layers. FIG. 3C illustrates the layouts of VIA1 82 and METAL2 84 layers. FIG. 3D illustrates the layouts of VIA2 86 and METAL3 88 layers.

Figure 3E:
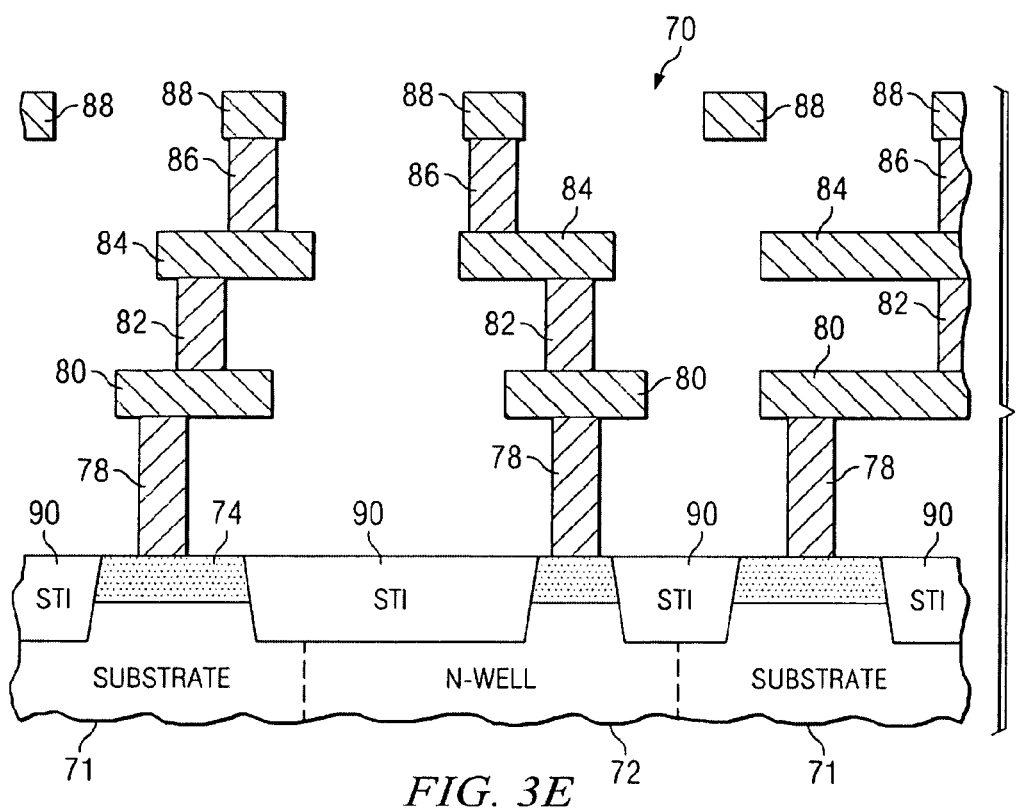
FIG. 3E is the cross sectional diagram along A-A of the layout in FIGS. 3B, 3C, and 3D.
Figure 3F:
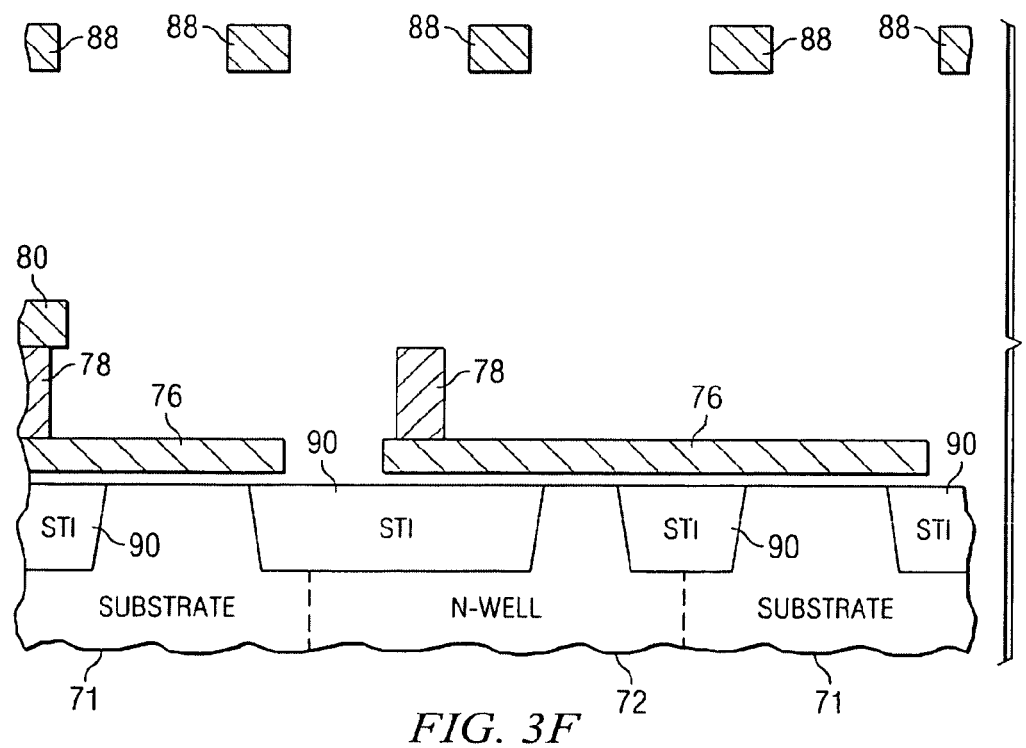
FIG. 3F is the cross sectional diagram along B-B of the layout in FIGS. 3B, 3C, and 3D.

FIGS. 3E and 3F are respectively the cross sectional diagrams along A-A and B-B of the layout in FIGS. 3B, 3C, and 3D. The nMOS and pMOS transistors are respectively formed in substrate 71 and NWELL 72. Individual transistors are isolated by shallow trench isolation 90 (STI). METAL1 80, METAL2 84, and METAL3 88 are the first, second, and third metal routing layers. CONTACT 78 is used to connect MOAT 74 or GATE 76 to METAL1 80. VIA1 82 is used to connect METAL1 80 to METAL2 84. VIA2 86 is used to connect METAL2 84 to METAL3 88. A CONTACT 78 can also be used to connect MOAT 74 and GATE 76 if it extends across both MOAT 74 and GATE 76, as shown in the center of FIG. 3B.

Figure 4A:
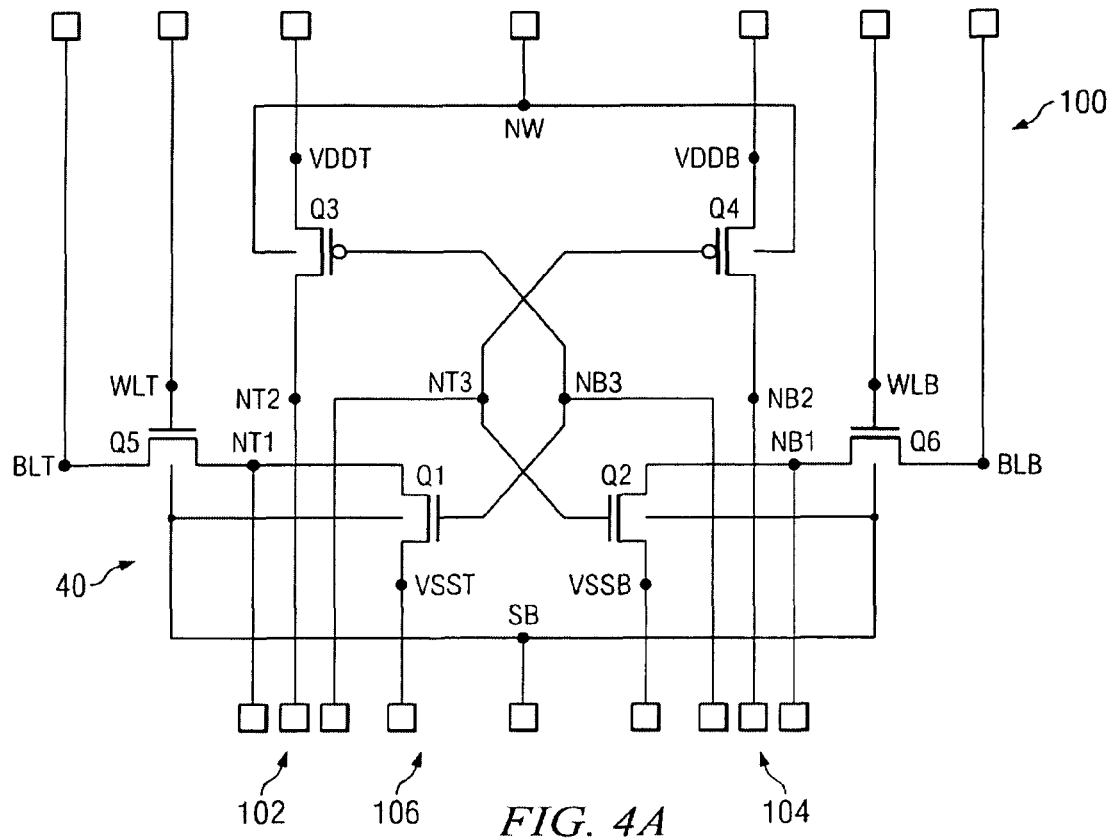
FIG. 4A is a schematic diagram of a structure for characterizing the standard 6T SRAM cell according to the principles of the present invention.

FIG. 4A is a schematic diagram of a structure 100 for characterizing the standard 6T SRAM cell 40 according to the principles of the present invention. The structure 100 comprises a memory base cell with top layer of GATE.

Figure 4B:
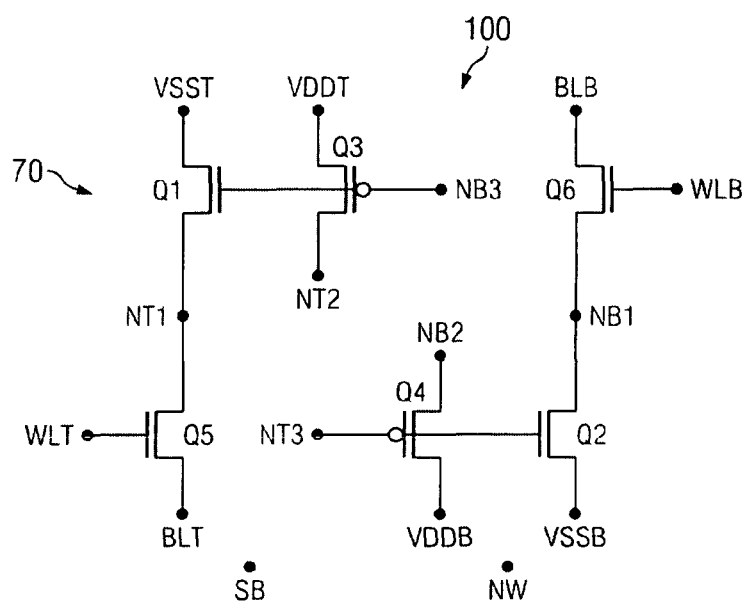
FIG. 4B is a schematic diagram of the memory base cell in the structure of FIG. 4A, with the circuit elements positioned in the same relationship as an SAR layout configuration.

FIG. 4B is a schematic diagram of the memory base cell in the structure 100 of FIG. 4A, with the circuit elements positioned in the same relationship 70 as an SAR layout configuration.

Figure 4C:
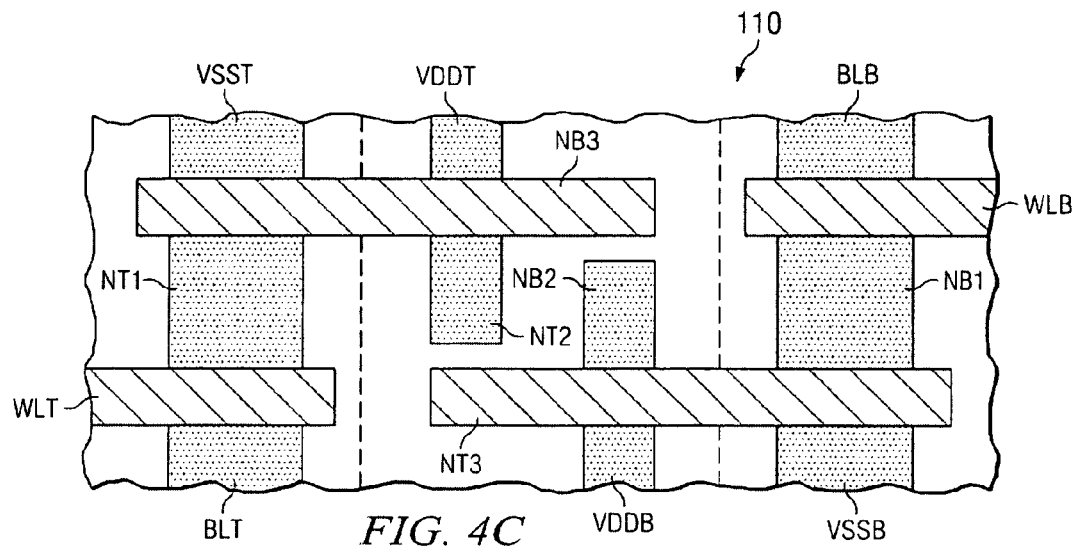
FIG. 4C is a layout diagram of the memory base cell of FIG. 4B in SAR layout configuration.

FIG. 4C is a layout diagram 110 of the memory base cell 70 of FIG. 4B in SAR layout configuration.

The term "memory base cell" of a memory cell is a cell which contains all the circuit elements (not including interconnect) of the memory cell, where the circuit elements in the memory base cell are sized, positioned, and engineered substantially the same as the corresponding ones in the memory cell, and hence have substantially the same characteristics as the corresponding ones in the memory cell. In a process in which the circuit elements are formed by the lower levels, a memory base cell constitutes the lower levels of the associated memory cell. A memory base cell may include additional levels beyond those required for formation of the circuit elements.

Generally, for MOS technology, a base cell will have substantially the same structure as the corresponding memory cell up at least through GATE layer. A memory base cell with top layer of GATE has substantially the same structure as the corresponding memory cell up through GATE and has no layers above GATE. A memory base cell with top layer of CONTACT has no layers above CONTACT. Similarly, a memory base cell with top layer of METAL1 has no layers above METAL1.

The memory base cell in the structure 100 of FIG. 4A comprises a first storage node set including nodes NT1, NT2, and NT3, a second storage node set including nodes NB1, NB2, and NB3, and a plurality of other nodes including two data nodes BLT and BLB respectively for accessing the first and second storage node sets, two access control nodes WLT and WLB respectively for controlling the access of the first and second storage node sets, two sinking supply nodes VSST and VSSB respectively for supplying the first and second storage node sets, two sourcing supply nodes VDDT and VDDB respectively for supplying the first and second storage node sets, a substrate node SB for biasing nMOS transistor body terminals, and an n-well node NW for biasing pMOS body terminals.

The term "storage node set" used here refers to either the storage node or a plurality of nodes that, when connected, form the storage node. For example, the storage node set in a memory base cell may comprise a plurality of nodes that, when connected together, form the storage node in the associated memory cell.

The phrase "for a storage node set" used here refers to: for any node in the storage node set.

The structure 100 of FIG. 4A further comprises a first port set 102, a second port set 104, and a plurality of other ports 106, where the nodes NT1, NT2, NT3 in the first storage node set are individually connected to the ports in the first port set 102, the nodes NB1, NB2, NB3 in the second storage node set are individually connected to the ports in the second port set 104, and the other nodes are individually connected to the other ports 106.

The term "port" used here refers to a structure for input and/or output from and/or to the circuit. In particular, a port is not a part of a memory cell and does not abut any structure in a memory cell. For example, connecting a storage node to a higher interconnect level may provide a port to the storage node. A port is not connected to another port unless explicitly stated.

The term "individually" used here refers to one-to-one. That is, the phrase "two nodes individually connect to two ports" means that one node connects to one port and another node connects to another port; it does not include the case where one node connects to two ports or two nodes connect to one port.

The structure 100 of FIG. 4A in fact comprises all nodes of the memory base cell 40. This is preferred because in this way all terminals of each circuit element in the memory base cell can be accessed for direct characterization of the memory cell circuit element.

However, there are cases where a node cannot be connected to a port because a contact cannot be made to the node due to technology constraints.

Figure 4D:
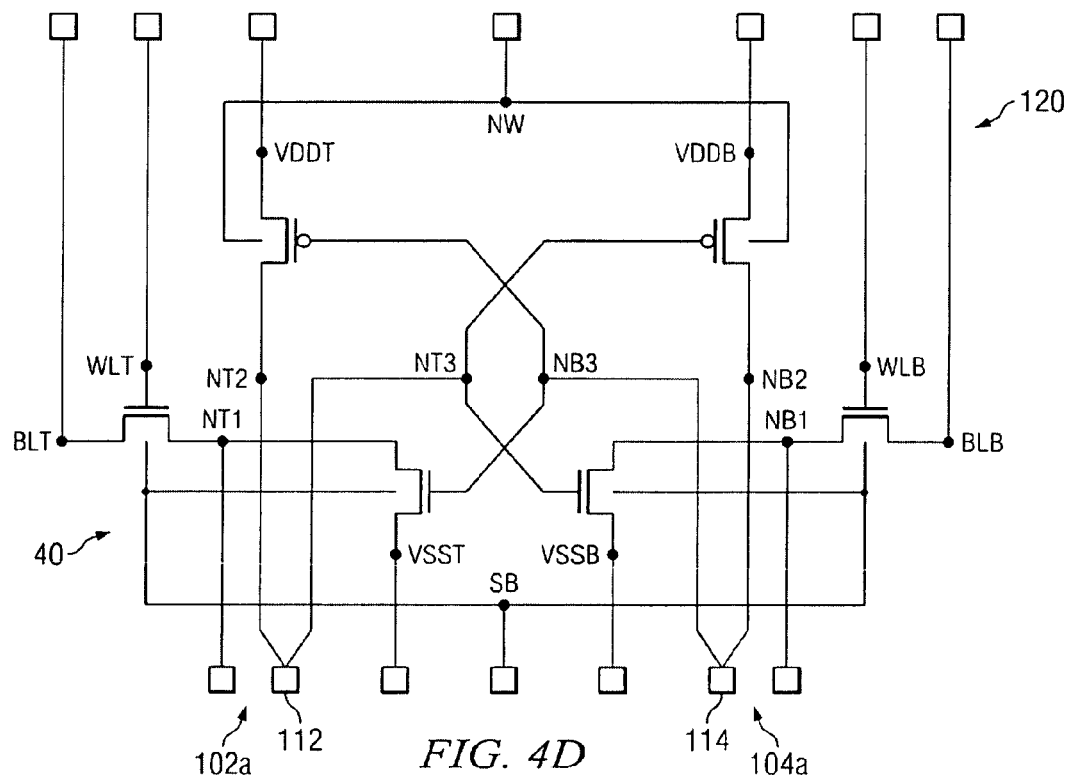
FIG. 4D is a schematic diagram of another structure for characterizing the standard 6T SRAM cell according to the principles of the present invention.

FIG. 4D is a schematic diagram of another structure 120 for characterizing the standard 6T SRAM cell 40 according to the principles of the present invention. The structure is identical to that of FIG. 4A except that (a) two nodes (NT2 and NT3) in the first storage node set are connected to a same port 112 in the first port set 102a and (b) two nodes (NB2 and NB3) in the second storage node set are connected to a same port 114 in the second port set 104a. In general, two or more nodes in a storage node set can be connected to a same port in the corresponding port set.

Figure 4E:
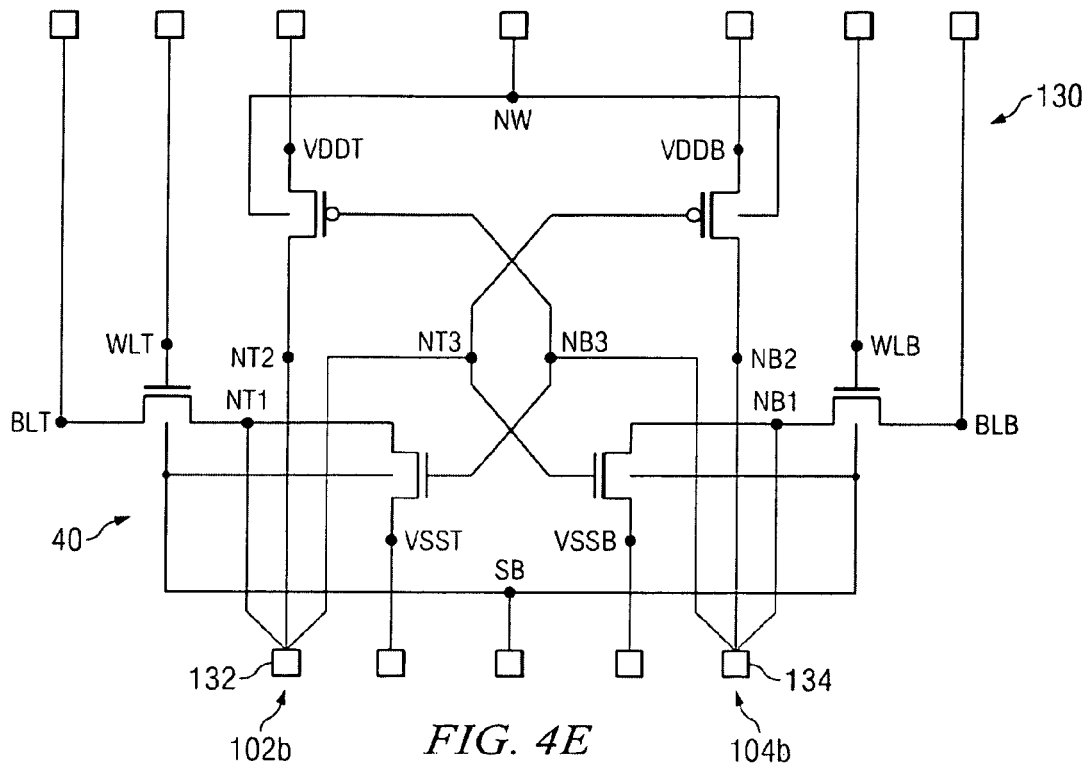
FIG. 4E is a schematic diagram of yet another structure for characterizing the standard 6T SRAM cell according to the principles of the present invention.

FIG. 4E is a schematic diagram of yet another structure 130 for characterizing the standard 6T SRAM cell 40 according to the principles of the present invention. The structure is identical to that of FIG. 4A except that (a) all nodes in the first storage node set are connected to a same port 132 in the first port set 102b consisting of one port and (b) all nodes in the second storage node set are connected to a same port 134 in the second port set 104b consisting of one port. In general, all nodes in a storage node set can be connected to a same port in the corresponding port set.

Figure 5A:
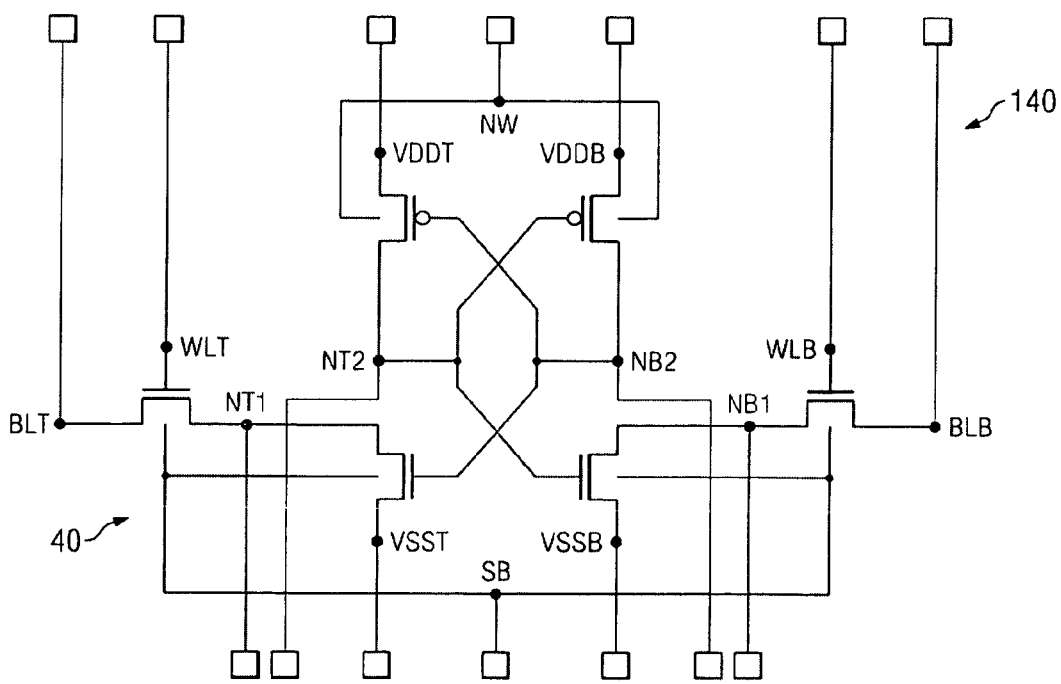
FIG. 5A is a schematic diagram illustrating yet another structure for characterizing the standard 6T SRAM cell according to the principles of the present invention.

FIG. 5A is a schematic diagram illustrating yet another structure 140 for characterizing the standard 6T SRAM cell 40 according to the principles of the present invention.

Figure 5B:
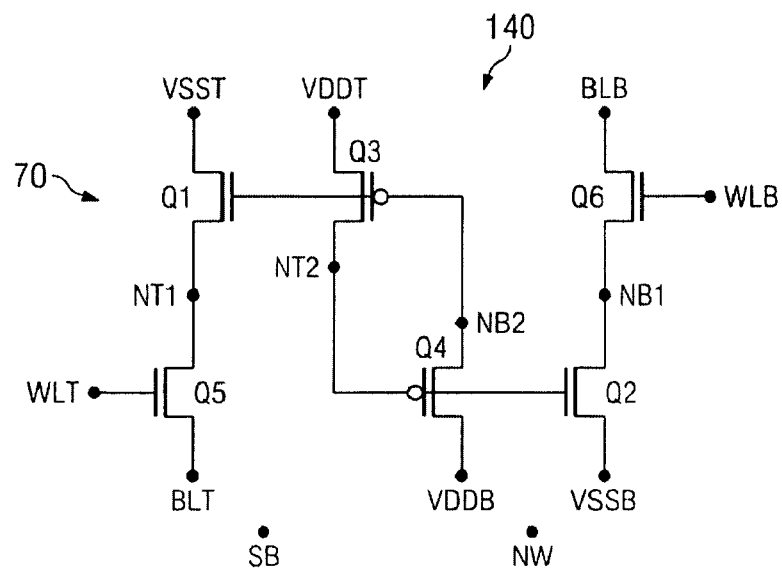
FIG. 5B is a schematic diagram illustrating the memory base cell in the structure of FIG. 5A, with the circuit elements positioned in the same relationship as SAR layout configuration.

FIG. 5B is a schematic diagram illustrating the memory base cell 70 in the structure 140 of FIG. 5A, with the circuit elements positioned in the same relationship as SAR layout configuration.

Figure 5C:
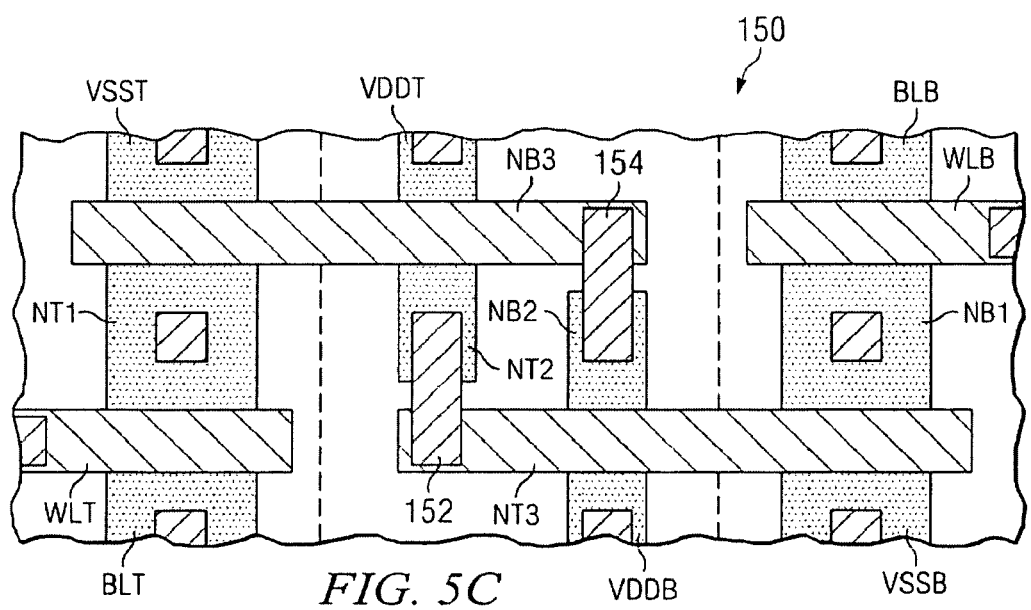
FIG. 5C is a layout diagram illustrating the memory base cell of FIG. 5B in SAR layout configuration.

FIG. 5C is a layout diagram 150 illustrating the memory base cell of FIG. 5B in SAR layout configuration.

The structure of FIG. 5A is identical to that of FIG. 4A except that (a) the memory base cell has a top layout of CONTACT, (b) the memory base cell is substantially the same as the corresponding memory cell (of FIGS. 3A, 3B, 3C and 3D) up through CONTACT layer, (c) node NT3 is connected to and merged into node NT2 at 152 accordingly, and (d) node NB3 is connected to and merged into node NB2 at 154 accordingly.

The structure 140 of FIG. 5A can also be viewed as a special case of the structure of FIG. 4D, where connecting two nodes to a same port is implemented by connecting the two nodes together using the CONTACT layer substantially the same as that of the corresponding memory cell.

Figure 5D:
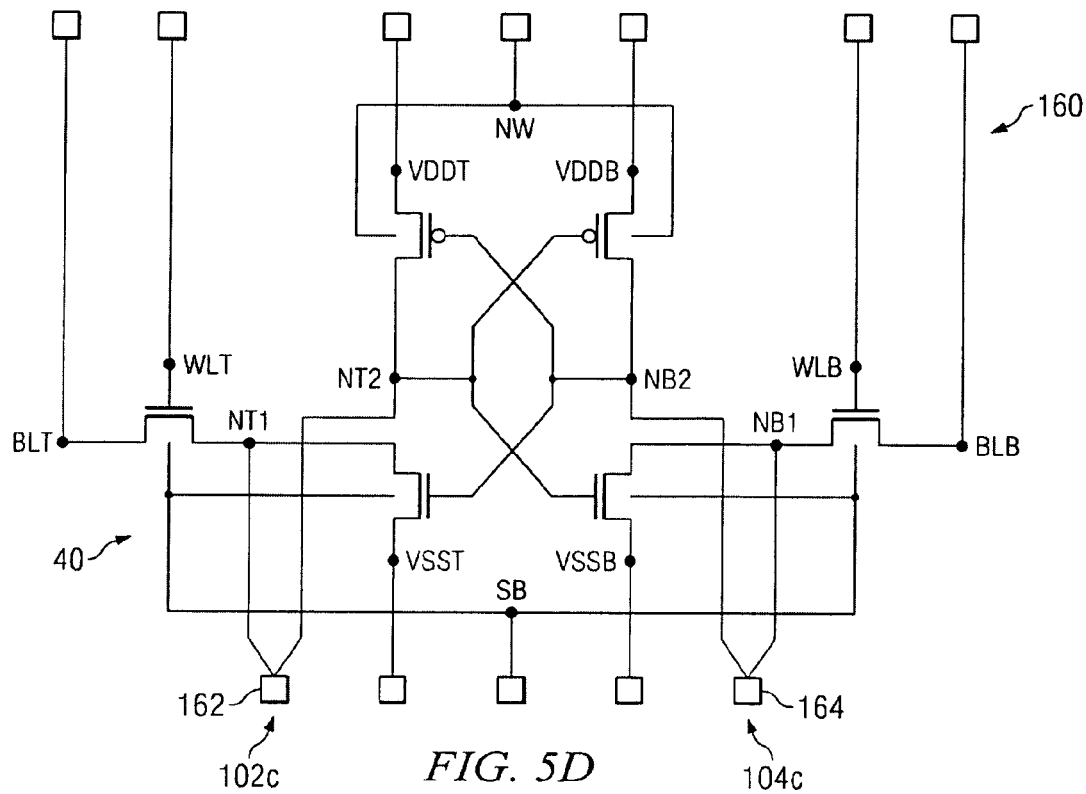
FIG. 5D is a schematic diagram illustrating yet another structure for characterizing the standard 6T SRAM cell according to the principles of the present invention.

FIG. 5D is a schematic diagram illustrating yet another structure 160 for characterizing the standard 6T SRAM cell 40 according to the principles of the present invention. The structure is identical to that of FIG. 5A except that (a) all nodes in the first storage node set are connected to a same port 162 in the first port set 102c consisting of one port and (b) all nodes in the second storage node set are connected to a same port 164 in the second port set 104c consisting of one port.

Figure 6A:
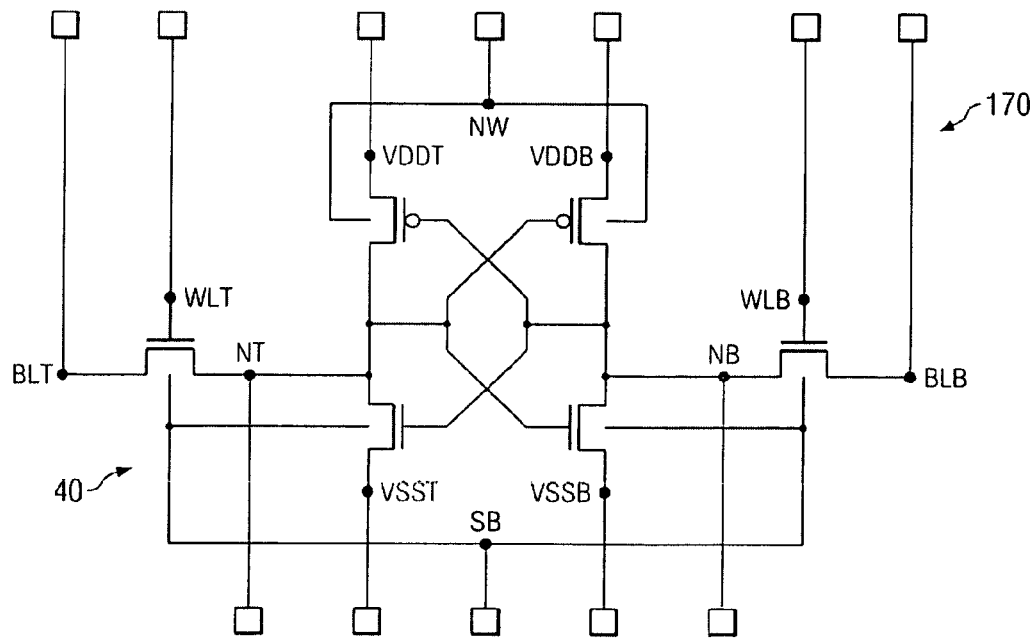
FIG. 6A is a schematic diagram illustrating yet another structure for characterizing the standard 6T SRAM cell according to the principles of the present invention.

FIG. 6A is a schematic diagram illustrating yet another structure 170 for characterizing the standard 6T SRAM cell 40 according to the principles of the present invention.

Figure 6B:
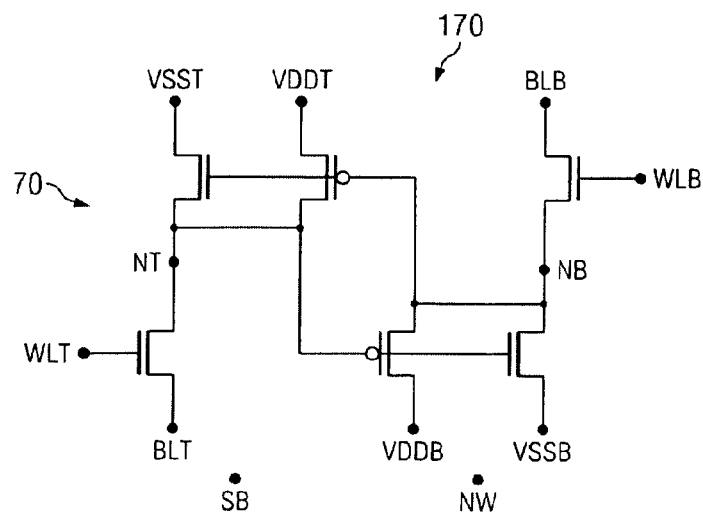
FIG. 6B is a schematic diagram illustrating the memory base cell in the structure of FIG. 6A, with the circuit elements positioned in the same relationship as an SAR layout configuration.

FIG. 6B is a schematic diagram illustrating the memory base cell in the structure 170 of FIG. 6A, with the circuit elements positioned in the same relationship as SAR layout configuration.

Figure 6C:
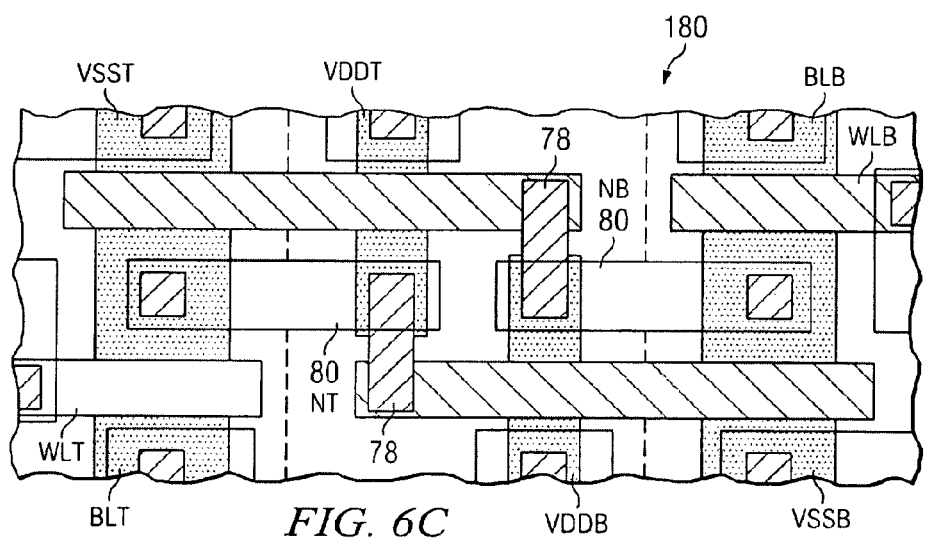
FIG. 6C is a layout diagram illustrating the memory base cell of FIG. 6B in SAR layout configuration.

FIG. 6C is a layout diagram 180 illustrating the memory base cell of FIG. 6B in SAR layout configuration.

The structure 170 of FIG. 6A is identical to that of FIG. 4A except that (a) the memory base cell has a top layout of METAL1 80, (b) the memory base cell is substantially the same as the corresponding memory cell (of FIGS. 3A, 3B, 3C and 3D) up through METAL1 layer 80, (c) nodes NT3, NT2, and NT1 are connected together to form a merged node NT accordingly, and (d) nodes NB3, NB2, and NB1 are connected together to form a merged node NB accordingly.

The structure of FIG. 6A can also be viewed as a special case of the structure of FIG. 4E, where connecting all nodes in a storage node set to a same port is implemented by connecting the nodes together using the CONTACT 78 and METAL1 80 layers substantially the same as those of the corresponding memory cell.

The structures of FIGS. 5A and 6A also show another aspect of the present invention in which a structure comprises a memory base cell and a plurality of ports, where the memory base cell comprises a plurality of nodes consisting of all nodes of the memory base cell that is connected to a top layer (CONTACT 78 in FIG. 5A and METAL1 80 in FIG. 6A) of the memory base cell, and where the plurality of nodes are individually connected to the plurality of ports.

Figure 7A:
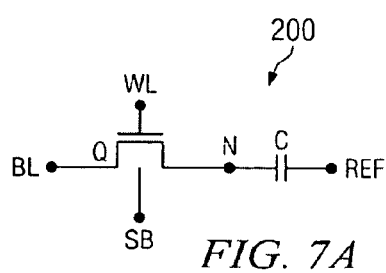
FIG. 7A is a schematic diagram illustrating a standard 1T1C DRAM cell.

FIG. 7A is a schematic diagram illustrating a standard 1T1C DRAM cell 200. The memory cell has a capacitor C and an nMOS pass gate transistor Q. It has five nodes including a storage node N, a data node (bit line node in this case) BL, an access control node (word line node in this case) WL, a reference node (sinking supply node in this case) REF, and a body node connecting to the body terminal of transistor Q, where N is the only storage node in the memory cell.

The term "reference node" in a memory cell used here refers to a node providing a reference voltage on one side of the circuit element serving as a storage media (e.g., capacitor in a DRAM cell) of the memory cell while the other side of the circuit element is connected to a storage node.

Figure 7B:
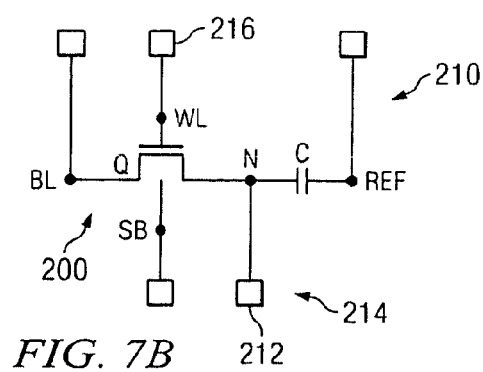
FIG. 7B is a schematic diagram illustrating a structure for characterizing a standard 1T1C DRAM cell according to the principles of the present invention.

FIG. 7B is a schematic diagram illustrating a structure 210 for characterizing a standard 1T1C DRAM cell 200 according to the principles of the present invention. The structure comprises a memory base cell of the DRAM cell. The memory base cell comprises a capacitor C having two terminals and an nMOS pass gate transistor Q having drain, gate, source, and body terminals. The memory base cell also comprises a storage node set consisting of just one node N. The storage node set is the only storage node set in the memory base cell. The memory base cell further comprises a set of other nodes including a data node BL, an access control node WL, a reference node REF, and a substrate node SB. The structure also comprises a port set and a set of other ports. Each node in the storage node set is connected to a port 212 in the port set 214. Each of the other nodes is connected to one of the other ports 216. Each of the other ports is connected to one and only one of the other nodes.

Figure 7C:
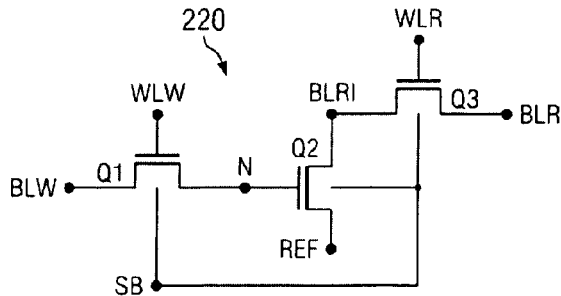
FIG. 7C is a schematic diagram illustrating a standard 3T DRAM cell.

FIG. 7C is a schematic diagram illustrating a standard 3T DRAM cell 220. The memory cell has an nMOS write pass gate transistor Q1, an nMOS driver transistor Q2, and an nMOS read pass gate transistor Q3, where the gate capacitance of Q2 serves as the storage capacitor. It has eight nodes including a storage node N, a write data node BLW, a write access control node WLW, a read data node BLR, an intermediate read data node BLRI, a read access control node WLR, a reference node REF, and a substrate node SB connecting to all nMOS transistor body terminals, where N is the only storage node in the memory cell.

Figure 7D:
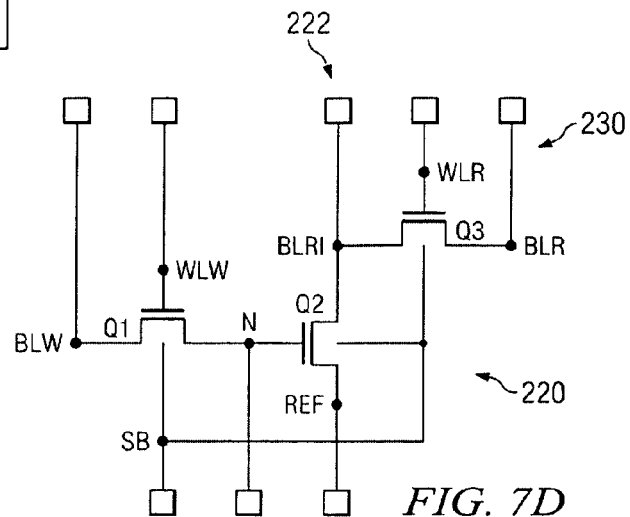
FIG. 7D is a schematic diagram illustrating a structure for characterizing the standard 3T DRAM cell according to the principles of the present invention.

FIG. 7D is a schematic diagram illustrating a structure 230 for characterizing the standard 3T DRAM cell 220 according to the principles of the present invention. The structure 230 comprises a memory base cell of the 3T DRAM cell. The memory base cell has an nMOS write pass-gate transistor Q1, an nMOS driver transistor Q2, an nMOS read pass-gate transistor Q3. It comprises a storage node set (consisting of a single node N in this case), and a set of other nodes including a write data node BLW, a write access control node WLW, a read data node BLR, an intermediate read data node BLRI, a read access control node WLR, a reference node REF, and a substrate node SB connecting to an nMOS transistor body terminal, where the storage node set is the only storage node set in the memory base cell. The structure 230 also comprises a port set 222 and a set of other ports. Each node in the node set is connected to a port in the port set 222. Each of the other nodes is connected to one of the other ports. Each of the other ports is connected to one and only one of the other nodes.

Optionally, the node BLRI between Q2 and Q3 is not included in the set of other nodes because it cannot in some instances be connected to a port due to the integrated circuit process constraints (e.g., there is no room for a CONTACT to be placed on node BLRI).

Figure 8B:
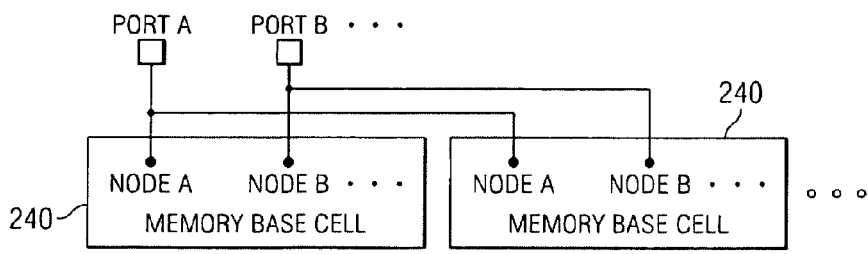
FIG. 8B is a diagram illustrating yet another aspect of the present invention, where two memory base cells are connected in parallel.
Figure 8C:
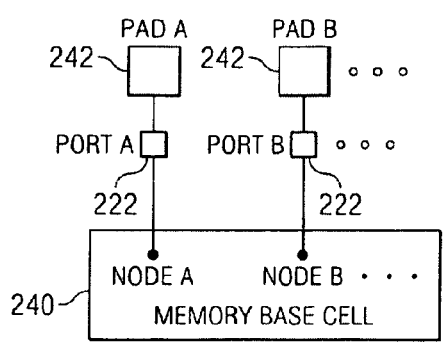
FIG. 8C is a diagram illustrating yet another aspect of the present invention, where the ports are individually connected to probe pads, bond pads, or bumps.
Figure 8D:
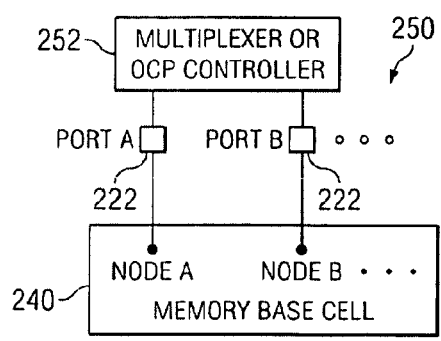
FIG. 8D is a diagram illustrating yet another aspect of the present invention, where the memory base cell is part of a multiplexed structure or an on chip parametric (OCP) measurement structure.
Figure 8A:
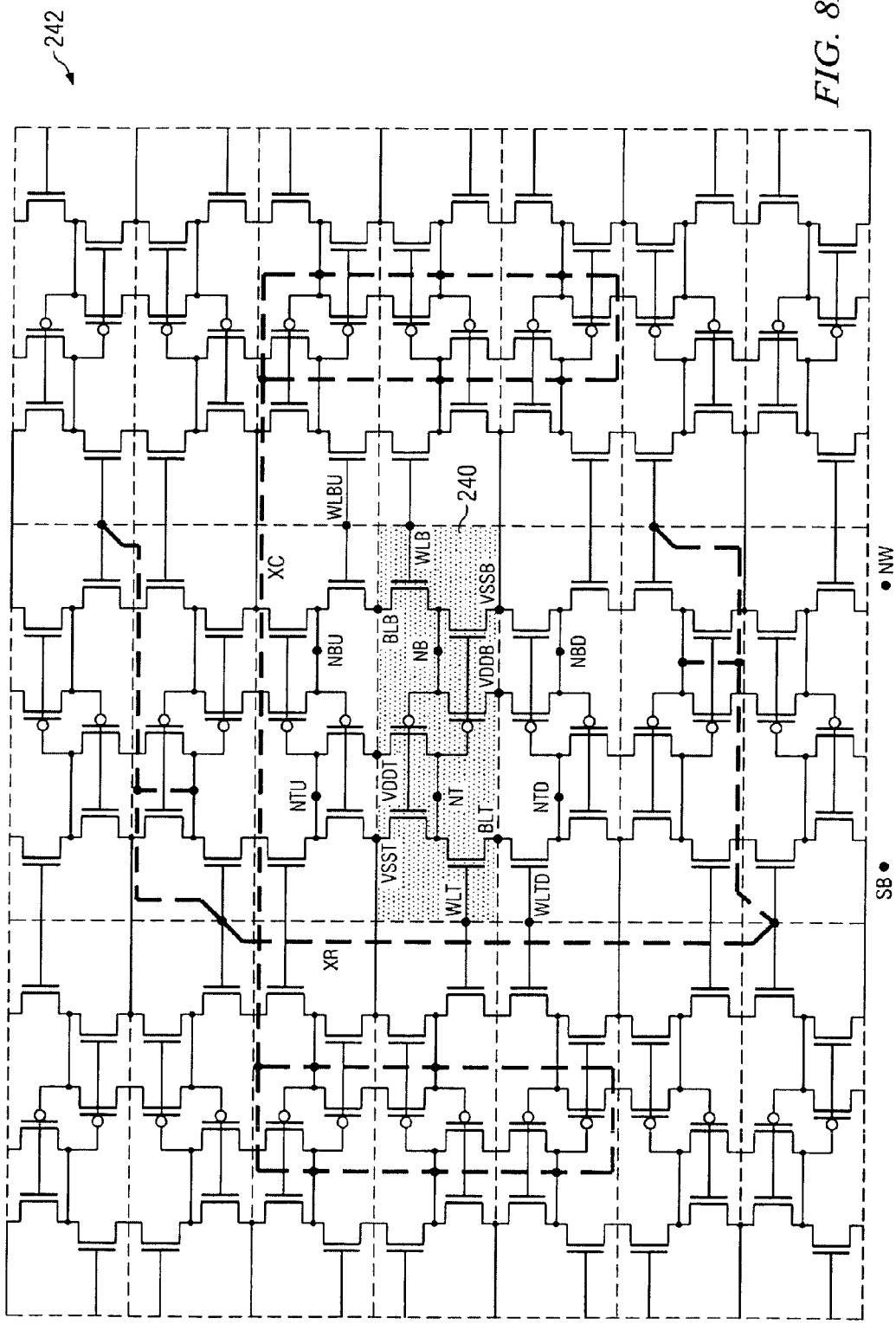
FIG. 8A is a schematic diagram illustrating another aspect of the present invention, where the memory base cell is in an array.

FIG. 8A is a schematic diagram illustrating another aspect of the present invention, where the memory base cell 240 is in an array 242. In addition to what is shown in FIGS. 6A, 6B, and 6C, the structure comprises a plurality of other memory base cells each adjacent to and substantially the same as the memory base cell, where the plurality of other memory base cells and the memory base cell altogether form an array 242 substantially the same configuration as a memory array, and where the set of other nodes further comprises the four storage nodes NTD, NBD, NTU, and NBU and the two access control nodes WLTD and WLBU in the plurality of other memory base cells.

FIG. 8B is a diagram illustrating yet another aspect of the present invention, where two memory base cells 240 are connected in parallel. In addition to what is shown in FIG. 4A, 4D, 4E, 5A, 5D, 6A, 7B, or 7D, the structure further comprises another memory base cell substantially the same as the memory base cell, where the nodes in the one or two storage node sets and the set of other nodes in one memory base cell are individually connected to the corresponding nodes in the other memory base cell as illustrated.

FIG. 8C is a diagram illustrating yet another aspect of the present invention, where the ports 222 are individually connected to probe pads, bond pads, or bumps 242. In addition to what is shown in FIG. 4A, 4D, 4E, 5A, 5D, 6A, 7B, or 7D, the structure further comprises a plurality of other structures each being one of a probe pad, a bond pad, and a bump, where the ports in the one or two port sets and the plurality of other ports are individually connected to the plurality of other structures.

FIG. 8D shows another aspect of the present invention, where the memory base cell 240 is part of a multiplexed structure or an on chip parametric (OCP) measurement structure 250. In addition to what is shown in FIG. 4A, 4D, 4E, 5A, 6A, 7B, or 7E, the structure is part of a multiplexed structure or an on chip parametric (OCP) measurement structure 250, where the ports in the one or two port set 222 and the set of other ports are individually connected to the multiplexer in the multiplexed structure or the OCP controller 252 in the OCP measurement structure.

The term "multiplexed structure" used here refers to a structure that multiplexes multiple port sets (each for a substructure) out to a common set of probe pads, bond pads, or bumps.

The term "on chip parametric" measurement structure used here refers to a structure for parametric measurement on a chip. Generally it has ports for enabling the measurement separate from ports of the primary circuit on the chip.

Figure 9:
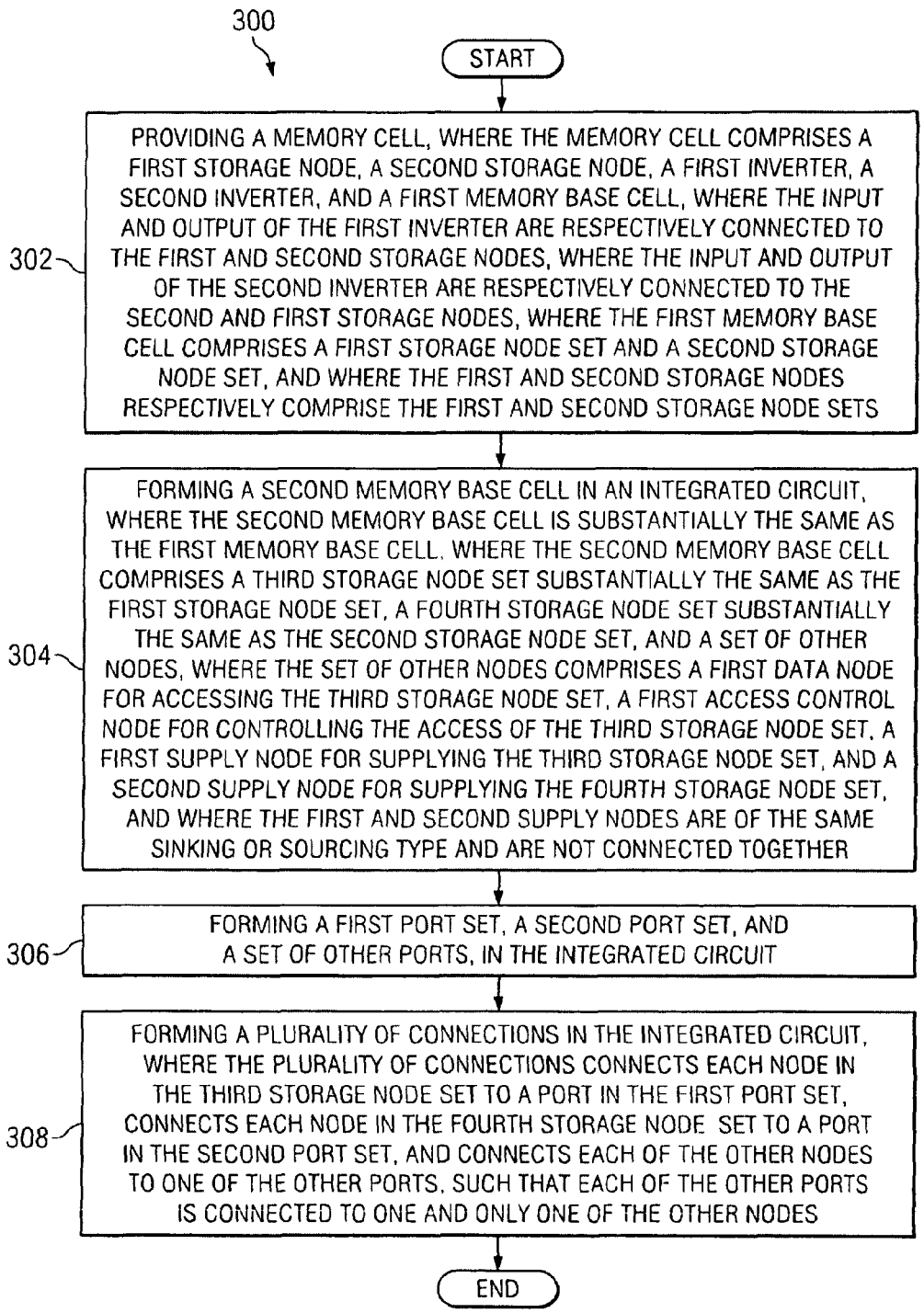
FIG. 9 is a flow chart illustrating a method of forming a structure according to the principles of the present invention.

FIG. 9 is a flow chart illustrating a method 300 of forming a structure according to the principles of the present invention. With this method, first, a memory cell is provided at 302, where the memory cell comprises a first storage node, a second storage node, a first inverter, a second inverter, and a first memory base cell, where the input and output of the first inverter are respectively connected to the first and second storage nodes, where the input and output of the second inverter are respectively connected to the second and first storage nodes, where the first memory base cell comprises a first storage node set and a second storage node set, and where the first and second storage nodes respectively comprise the first and second storage node sets.

Then, a second memory base cell in an integrated circuit is formed at 304, where the second memory base cell is substantially the same as the first memory base cell, where the second memory base cell comprises a third storage node set substantially the same as the first storage node set, a fourth storage node set substantially the same as the second storage node set, and a set of other nodes, where the set of other nodes comprises a first data node for accessing the third storage node set, a first access control node for controlling the access of the third storage node set, a first supply node for supplying the third storage node set, and a second supply node for supplying the fourth storage node set, and where the first and second supply nodes are of the same sinking or sourcing type and are connected together.

A first port set, a second port set, and a set of other ports, in the integrated circuit are also formed at 306.

A plurality of connections in the integrated circuit is also formed at 308, where the plurality of connections connects each node in the third storage node set to a port in the first port set, connects each node in the fourth storage node set to a port in the second port set, and connects each of the other nodes to one of the other ports, such that each of the other ports is connected to one and only one of the other nodes.

Figure 10:
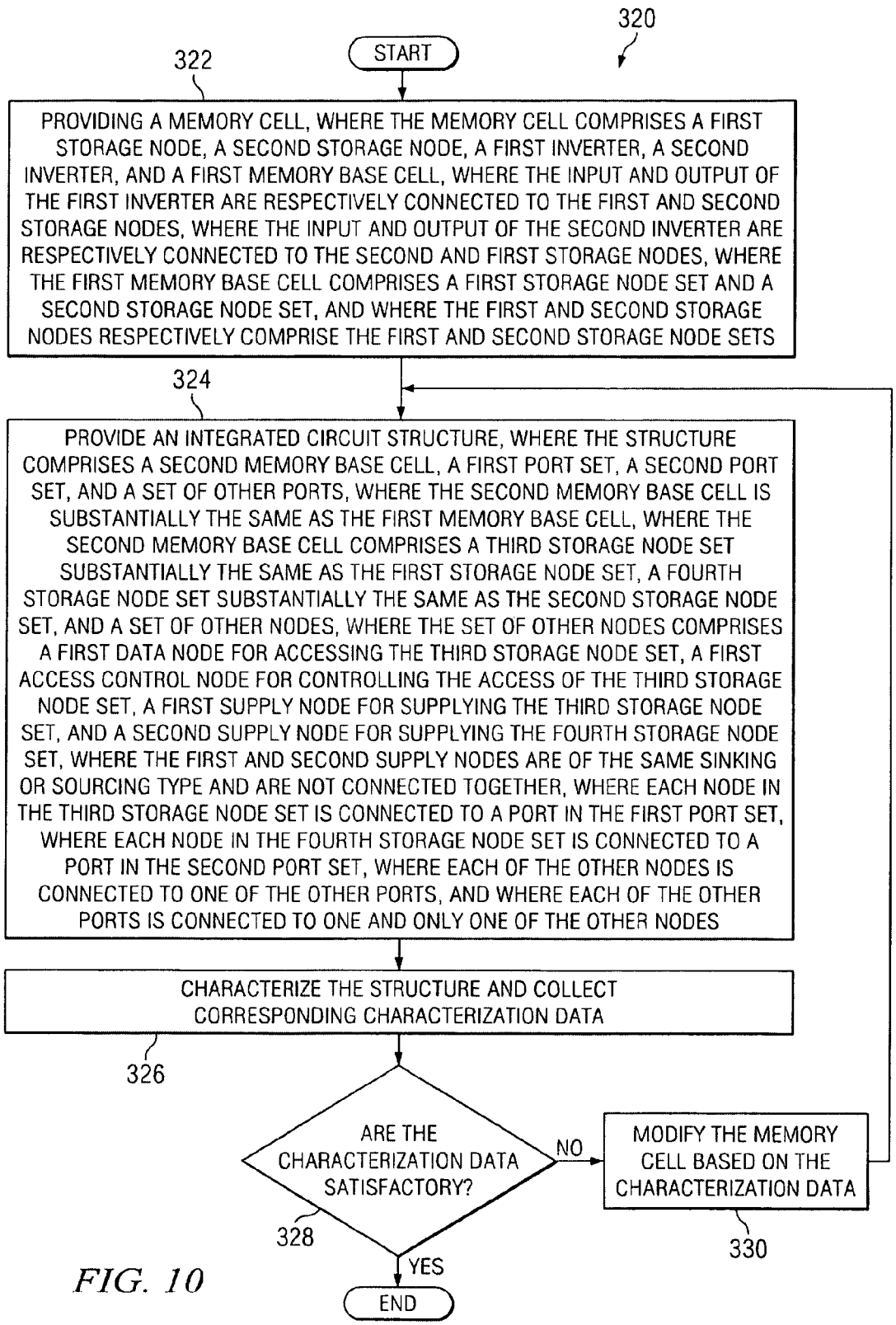
FIG. 10 is a flow chart illustrating a method of designing a memory cell according to the principles of the present invention.

FIG. 10 is a flow chart illustrating a method 320 of designing a memory cell according to the principles of the present invention. With this method, first, a memory cell is provided at 322, where the memory cell comprises a first storage node, a second storage node, a first inverter, a second inverter, and a first memory base cell, where the input and output of the first inverter are respectively connected to the first and second storage nodes, where the input and output of the second inverter are respectively connected to the second and first storage nodes, where the first memory base cell comprises a first storage node set and a second storage node set, and where the first and second storage nodes respectively comprise the first and second storage node sets.

Then, an integrated circuit structure is provided at 324, where the structure comprises a second memory base cell, a first port set, a second port set, and a set of other ports, where the second memory base cell is substantially the same as the first memory base cell, where the second memory base cell comprises a third storage node set substantially the same as the first storage node set, a fourth storage node set substantially the same as the second storage node set, and a set of other nodes, where the set of other nodes comprises a first data node for accessing the third storage node set, a first access control node for controlling the access of the third storage node set, a first supply node for supplying the third storage node set, and a second supply node for supplying the fourth storage node set, where the first and second supply nodes are of the same sinking or sourcing type and are not connected together, where each node in the third storage node set is connected to a port in the first port set, where each node in the fourth storage node set is connected to a port in the second port set, where each of the other nodes is connected to one of the other ports, and where each of the other ports is connected to one and only one of the other nodes.

Next, the structure is tested to generate characterization data at 326. If the characterization data are not satisfactory at 328, then the memory cell is modified at 330, based on the characterization data. Then the above steps are repeated for the modified memory cell at 324.

Figure 11A:
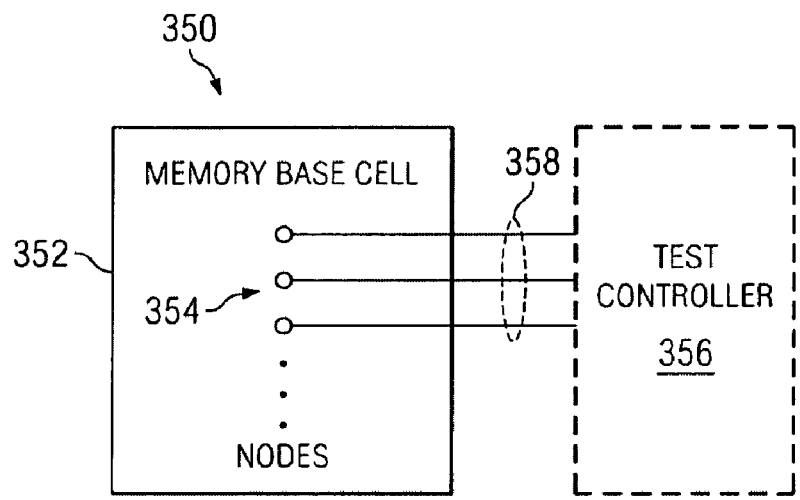
FIG. 11A is a diagram illustrating a memory cell test system according to the principles of the present invention.

FIG. 11A is a diagram illustrating a memory cell test system 350 according to the principles of the present invention. The test system comprises a memory base cell 352 having a plurality of nodes 354. The test system also comprises a test controller 356 and a plurality of connections 358 that allow direct access to the nodes 354 from the test controller 356. The test controller 356 can be a tester outside of the wafer, an on-chip parametric (OCP) test controller, or an on-chip multiplexer based test controller. The test controller 356 can connect two or more nodes 354 together (through a relay network, for example) to form a combined node, leave a node or a combined node floating, directly force a physical quantity on to a node or a combined node, and directly measure a physical quantity at a node or a combined node.

The term "electrical quantity" used herein includes a voltage or a current.

The term "directly force" used here refers to force without passing through any circuit element in a memory cell.

The term "directly measure" used here refers to measure without passing through any circuit element in a memory cell.

Figure 11B:
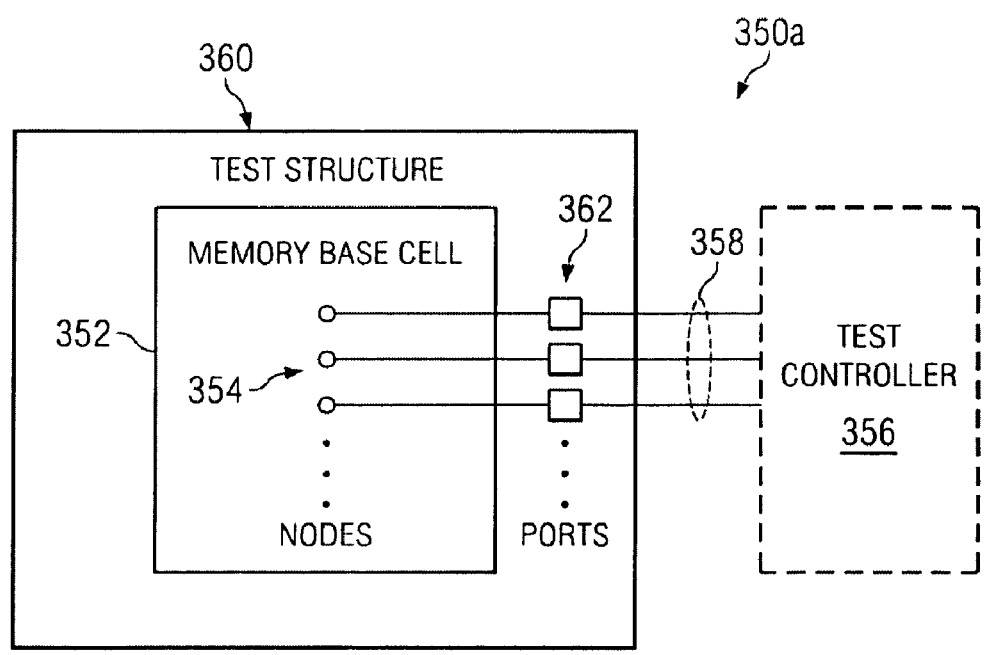
FIG. 11B is a diagram illustrating a more specific memory cell test system according to the principles of the present invention.

FIG. 11B is a diagram illustrating a more specific memory cell test system 350*a* according to the principles of the present invention. It is the same as the test system 350 of FIG. 11A, except that it further comprises a test structure 360, where the test structure 360 comprises the memory base cell 352 and a plurality of ports 362 connecting to the plurality of nodes 354, and where the connections 358 from the test controller 356 to the nodes are made through the ports 362.

Figure 12:
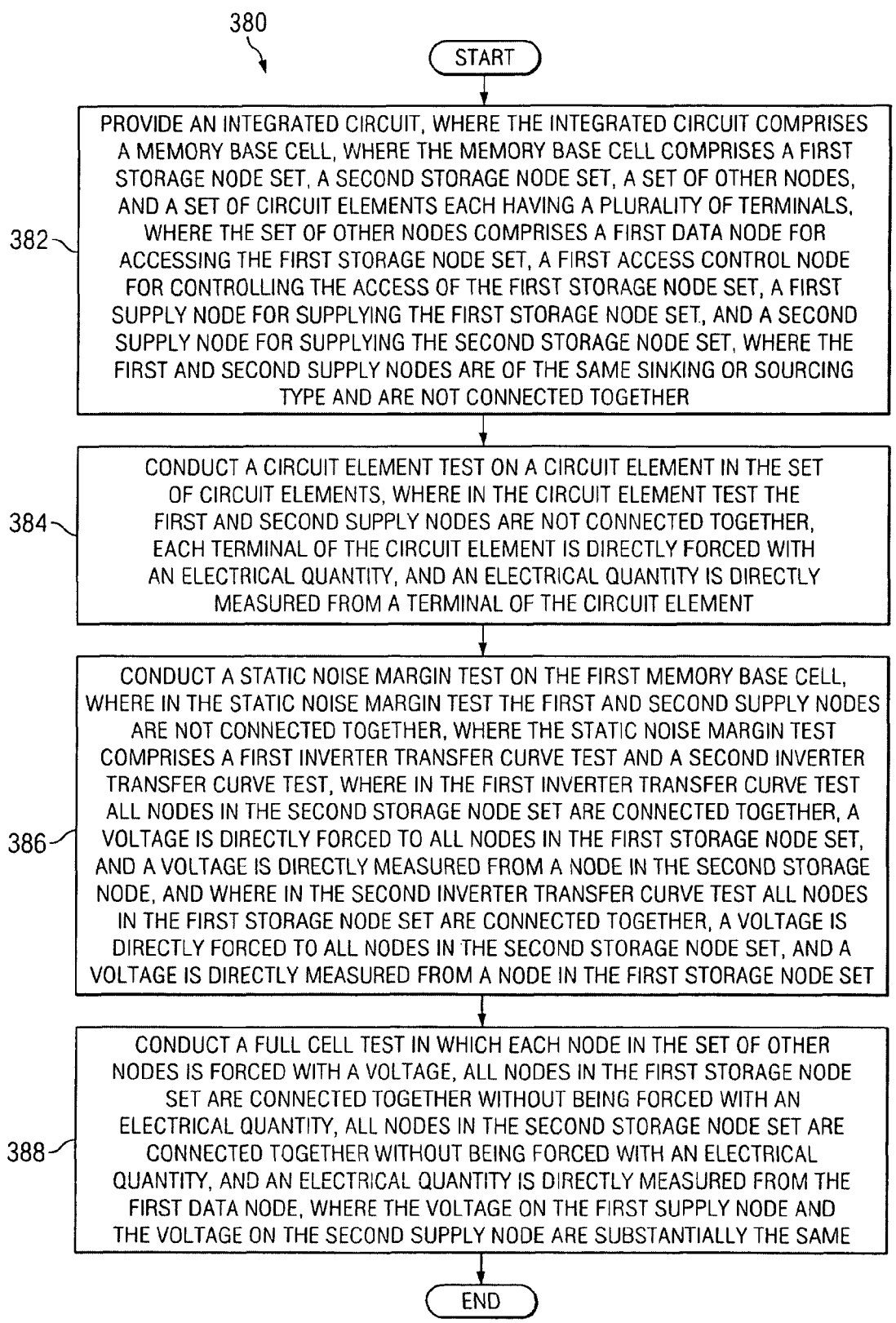
FIG. 12 is a flow chart illustrating a test method according to the principles of the present invention.
Figure 13A:
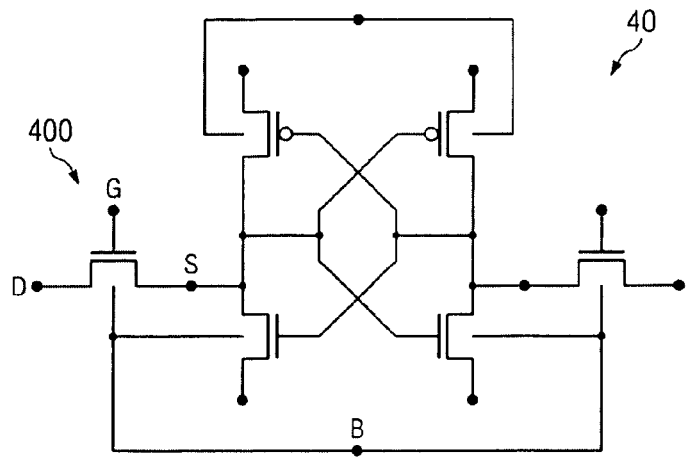
FIG. 13A is a diagram illustrating the test of the left pass gate transistor of the standard 6T SRAM cell according to the principles of the present invention.
Figure 13B:
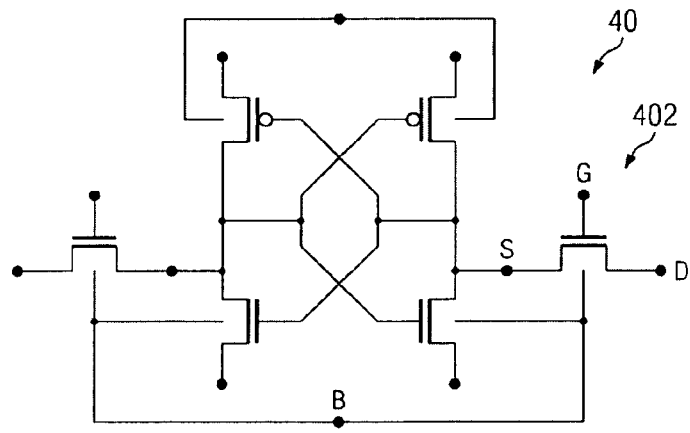
FIG. 13B is a diagram illustrating the test of the right pass gate transistor of the standard 6T SRAM cell according to the principles of the present invention.
Figure 13C:
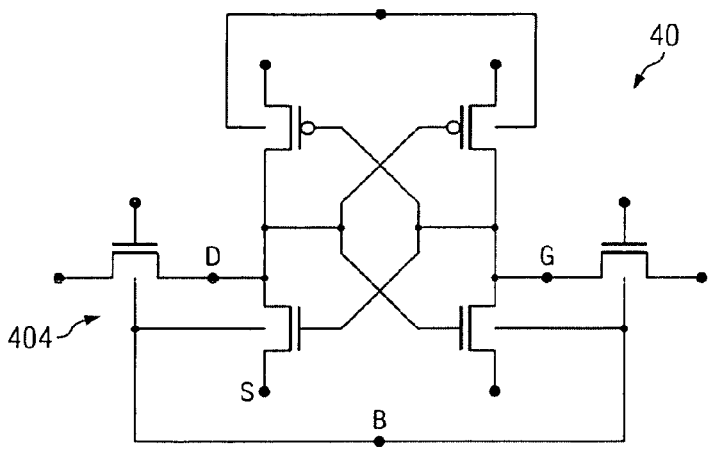
FIG. 13C is a diagram illustrating the test of the left driver transistor of the standard 6T SRAM cell according to the principles of the present invention.
Figure 13D:
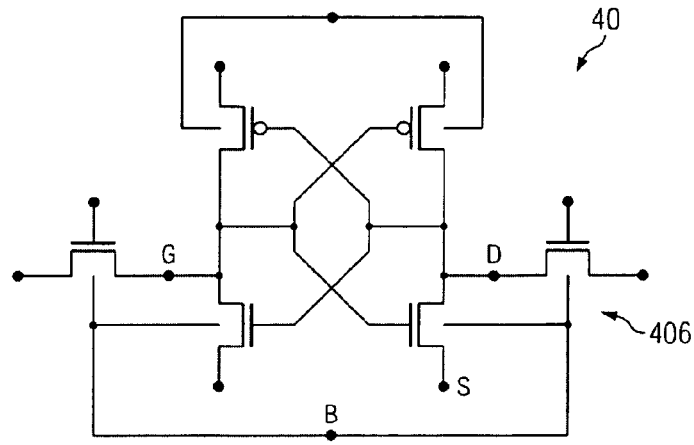
FIG. 13D is a diagram illustrating the test of the right driver transistor of the standard 6T SRAM cell according to the principles of the present invention.
Figure 13E:
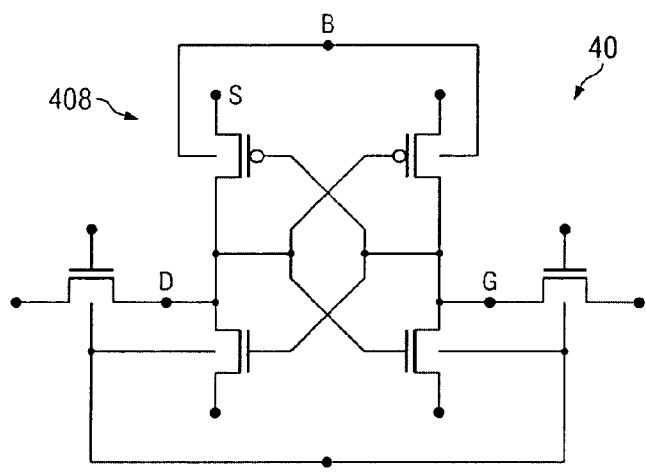
FIG. 13E is a diagram illustrating the test of the left load transistor of the standard 6T SRAM cell according to the principles of the present invention.
Figure 13F:
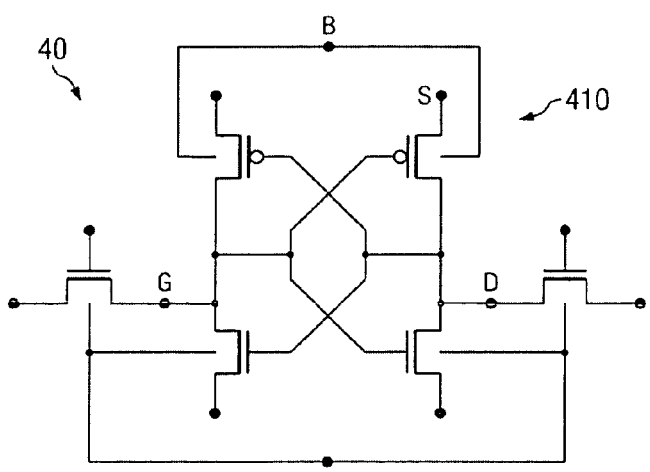
FIG. 13F is a diagram illustrating the test of the right load transistor of the standard 6T SRAM cell according to the principles of the present invention.

FIG. 12 is a flow chart illustrating a test method 380 according to the principles of the present invention. With this method, first an integrated circuit is provided at 382, where the integrated circuit comprises a memory base cell, where the first memory base cell comprises a first storage node set, a second storage node set, a set of other nodes, and a set of circuit elements each having a plurality of terminals, where the set of other nodes comprises a first data node for accessing the first storage node set, a first access control node for controlling the access of the first storage node set, a first supply node for supplying the first storage node set, and a second supply node for supplying the second storage node set, where the first and second supply nodes are of the same sinking or sourcing type and are not connected together.

Then, a circuit element test on a circuit element in the set of circuit elements is conducted at 384, where in the circuit element test the first and second supply nodes are not connected together, each terminal of the circuit element is directly forced with an electrical quantity, and an electrical quantity is directly measured from a terminal of the circuit element.

Next, a static noise margin test on the first memory base cell is conducted at 386, where in the static noise margin test the first and second supply nodes are not connected together, where the static noise margin test comprises a first inverter transfer curve test and a second inverter transfer curve test, where in the first inverter transfer curve test all nodes in the second storage node set are connected together, a voltage is directly forced to all nodes in the first storage node set, and a voltage is directly measured from a node in the second storage node, and where in the second inverter transfer curve test all nodes in the first storage node set are connected together, a voltage is directly forced to all nodes in the second storage node set, and a voltage is directly measured from a node in the first storage node set.

Finally, a full cell test is conducted at 388 in which each node in the set of other nodes is forced with a voltage, all nodes in the first storage node set are connected together without being forced with an electrical quantity, all nodes in the second storage node set are connected together without being forced with an electrical quantity, and an electrical quantity is directly measured from the first data node, where the voltage on the first supply node and the voltage on the second supply node are substantially the same.

The term "circuit element test" refers to a test of the characteristics of a circuit element. Typical characteristics of a MOS transistor include current-voltage curves, threshold voltages, on current, and off current.

The term "static noise margin test" used here refers to a test of a static noise margin of a memory cell. This includes the well known "butterfly-curve" based measurement which includes the tests of the voltage transfer curves of both inverters in the memory cell.

The term "full cell test" used here refers to a test of a cell characteristic based on a full memory cell configuration. Typical characteristics obtained from a full cell test of a standard 6T SRAM cell include trip voltages, read currents, minimum write voltage, minimum and maximum read voltages, and minimum data-retention voltage.

FIGS. 13A-13F are diagrams respectively illustrating the tests of left pass gate transistor 400, right pass gate transistor 402, left driver transistor 404, right driver transistor 406, left load transistor 408, and right load transistor 410, in the standard 6T SRAM cell 40, based on the test system of FIG. 11A or FIG. 11B and the test method of FIG. 12, according to the principles of the present invention. The nodes corresponding to the drain, gate, source, and body of a transistor in a memory base cell are respectively assigned D, G, S, and B signals in the test system. Any existing transistor test procedure can then follow.

Figure 14A:
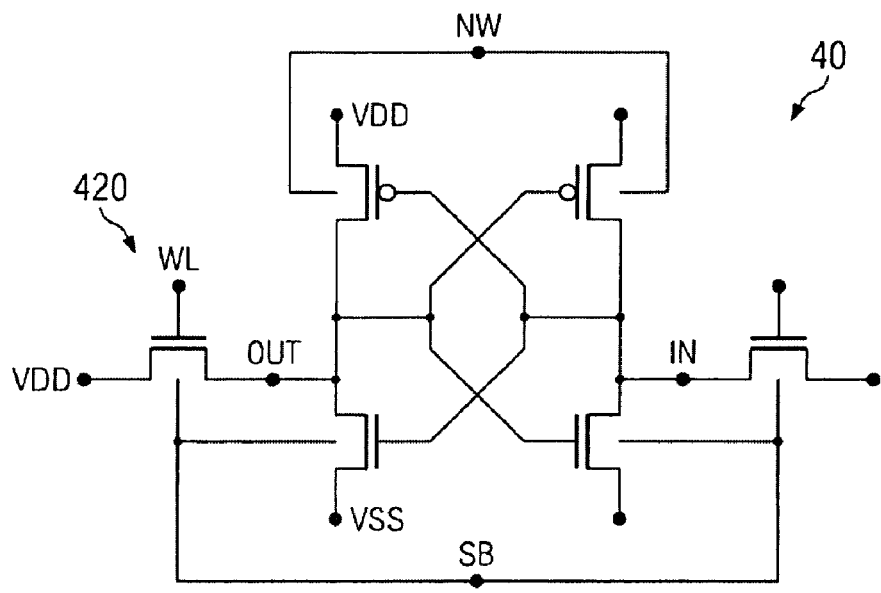
FIG. 14A is a diagram illustrating the test of the left inverter transfer curve for the standard 6T SRAM cell according to the principles of the present invention.
Figure 14B:
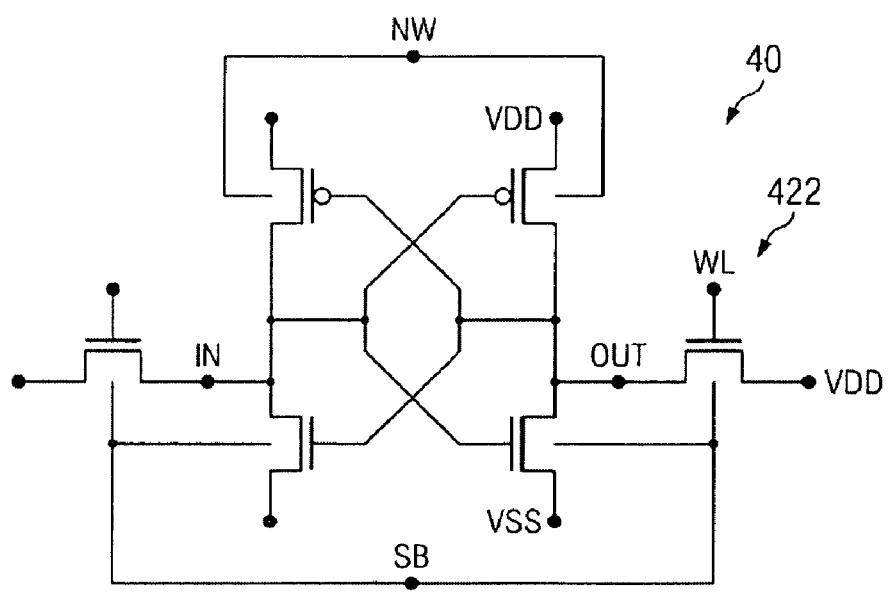
FIG. 14B is a diagram illustrating the test of the right inverter transfer curve for the standard 6T SRAM cell according to the principles of the present invention.

FIGS. 14A and 14B are diagrams respectively illustrating the left and right inverter transfer curve tests 420, 422 for the standard 6T SRAM cell 40, based on the test system 350 of FIG. 11A or FIG. 11B and the test method 380 of FIG. 12, for static noise margin (SNM) calculation, according to the principles of the present invention. In each test, the nodes corresponding to the input, output, word line, sourcing supply, sinking supply, nwell, and substrate of an inverter configured from the memory base cell are respectively assigned IN, OUT, WL, VDD, VSS, NW, AND SB signals in the test system, and a standard inverter transfer curve test can then follow, such as directly forcing a series of voltages on IN and directly measuring the corresponding voltages at OUT.

Figure 15:
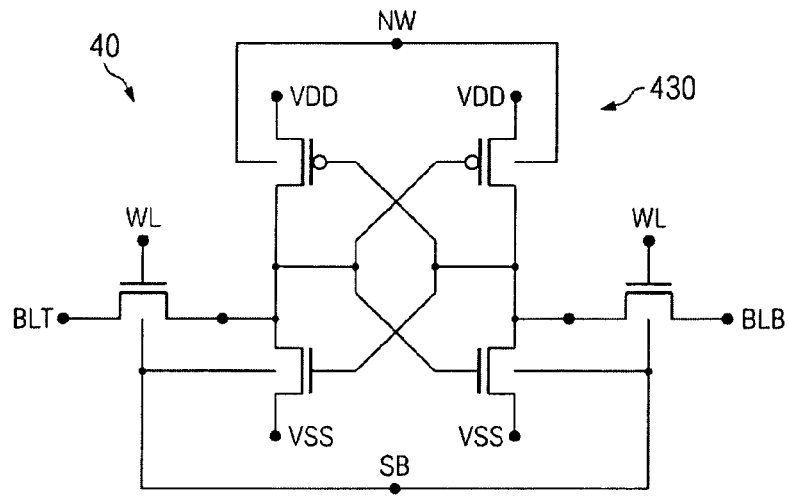
FIG. 15 is a diagram illustrating a full cell test for the standard 6T SRAM cell according to the principles of the present invention.

FIG. 15 is a diagram illustrating a full cell test 430 for the standard 6T SRAM cell 40, based on the test system 350 of FIG. 11A or FIG. 11B and the test method 380 of FIG. 12, according to the principles of the present invention. In the test, the nodes corresponding to the word line, bit line true, bit line bar, sourcing supply, sinking supply, nwell, and substrate of a full cell configured from the memory base cell are respectively assigned WL, VDD, VSS, NW, AND SB signals in the test system, and a full cell based test procedure can then follow, such as commonly known trip voltage test, read current test, minimum write voltage test, minimum and maximum read voltage tests, and minimum data retention voltage test. The two storage nodes are left floating.

Figure 16A:
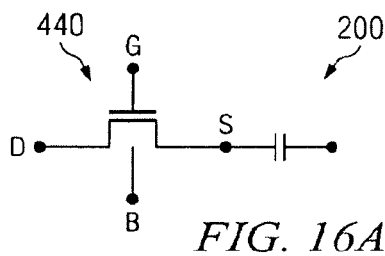
FIG. 16A is a diagram illustrating the test of a pass gate transistor of the standard 1T1C DRAM cell according to the principles of the present invention.
Figure 16B:
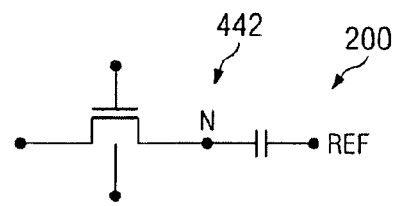
FIG. 16B is a diagram illustrating the test of a capacitor of the standard 1T1C DRAM cell according to the principles of the present invention.

FIGS. 16A and 16B are diagrams respectively illustrating the tests 440, 442 of pass gate transistor and capacitor in the standard 1T1C DRAM cell 200, based on the test system 350 of FIG. 11A or FIG. 11B, according to the principles of the present invention. In FIG. 16A, the nodes corresponding to the drain, gate, source, and body of the pass gate transistor are respectively assigned D, G, S, and B signals in the test system 350. Any existing transistor test procedure can then follow. In FIG. 16B, the nodes corresponding to the anode and cathode of the capacitor are respectively assigned A and K signals in the test system 350, and a capacitor test can then follow.

Figure 16C:
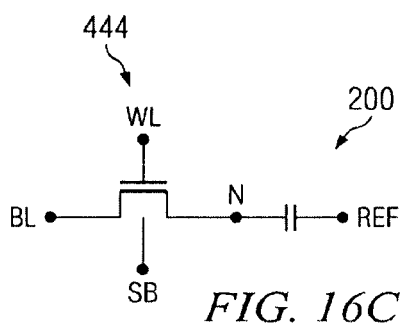
FIG. 16C is a diagram illustrating a full cell test of the standard 1T1C DRAM cell according to the principles of the present invention.

FIG. 16C is a diagram illustrating a full cell test 444 of the standard 1T1C DRAM cell 200, based on the test system 350 of FIG. 11A or FIG. 11B, according to the principles of the present invention. In this test, the storage node N is left floating, each of the other nodes is directly forced with a voltage, and currents on selected nodes and optionally voltage on the storage node are directly measured.

Figure 17:
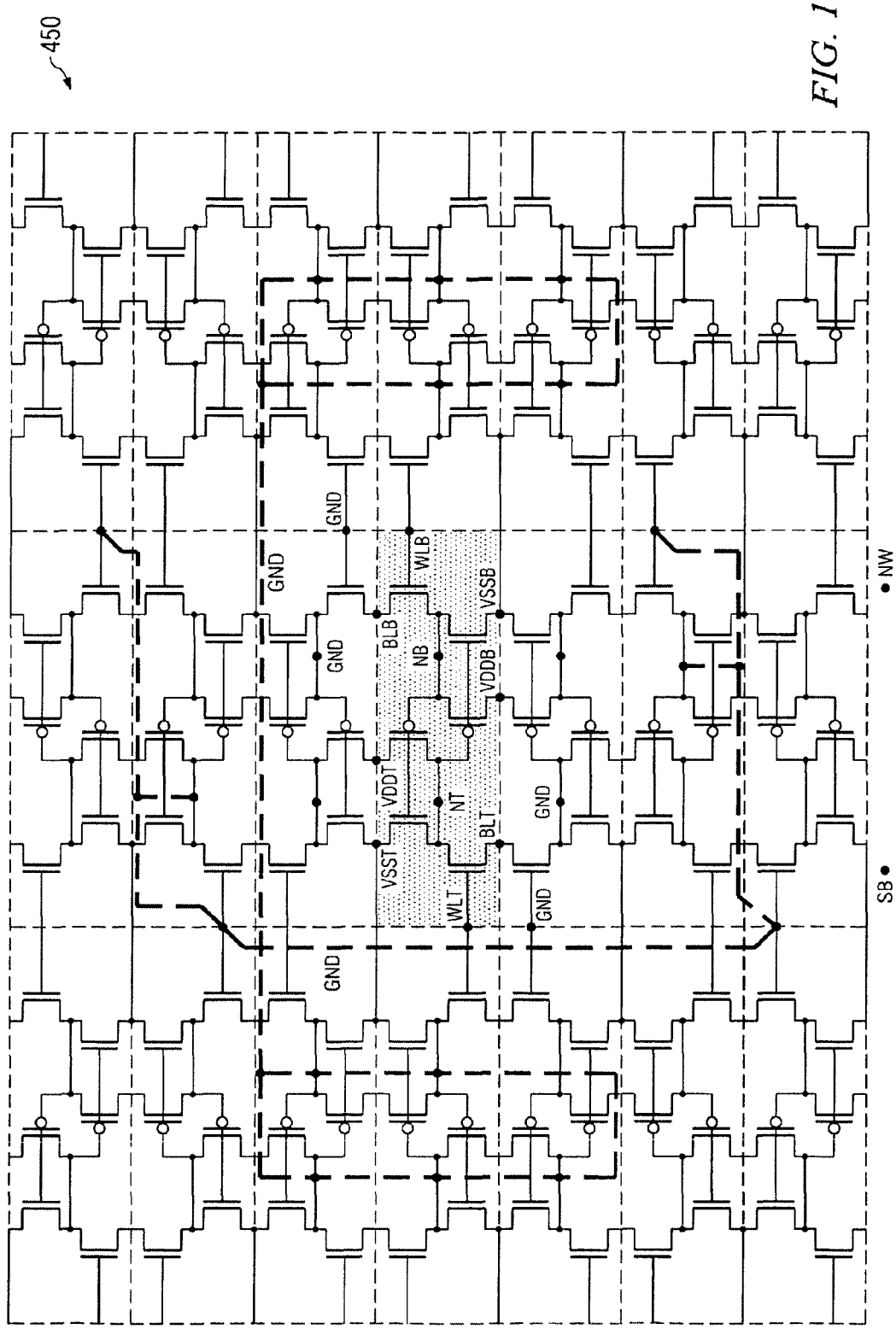
FIG. 17 is a diagram illustrating another aspect of the present invention, where the storage nodes and access control nodes in the neighboring memory base cells are biased to cut off sneak path.

FIG. 17 is a diagram 450 illustrating another aspect of the present invention, where the storage nodes and access control nodes in the neighboring memory base cells are biased to cut off sneak path. In this case, most of these nodes are ground (forced to 0V) and some are left floating, as referencing to FIG. 8A. In a particular test, one or more of these nodes can be biased differently or even be forced with a changing voltage that tracks another changing voltage, in order to minimize the leakage and hence noise in the measurement.

Figure 18:
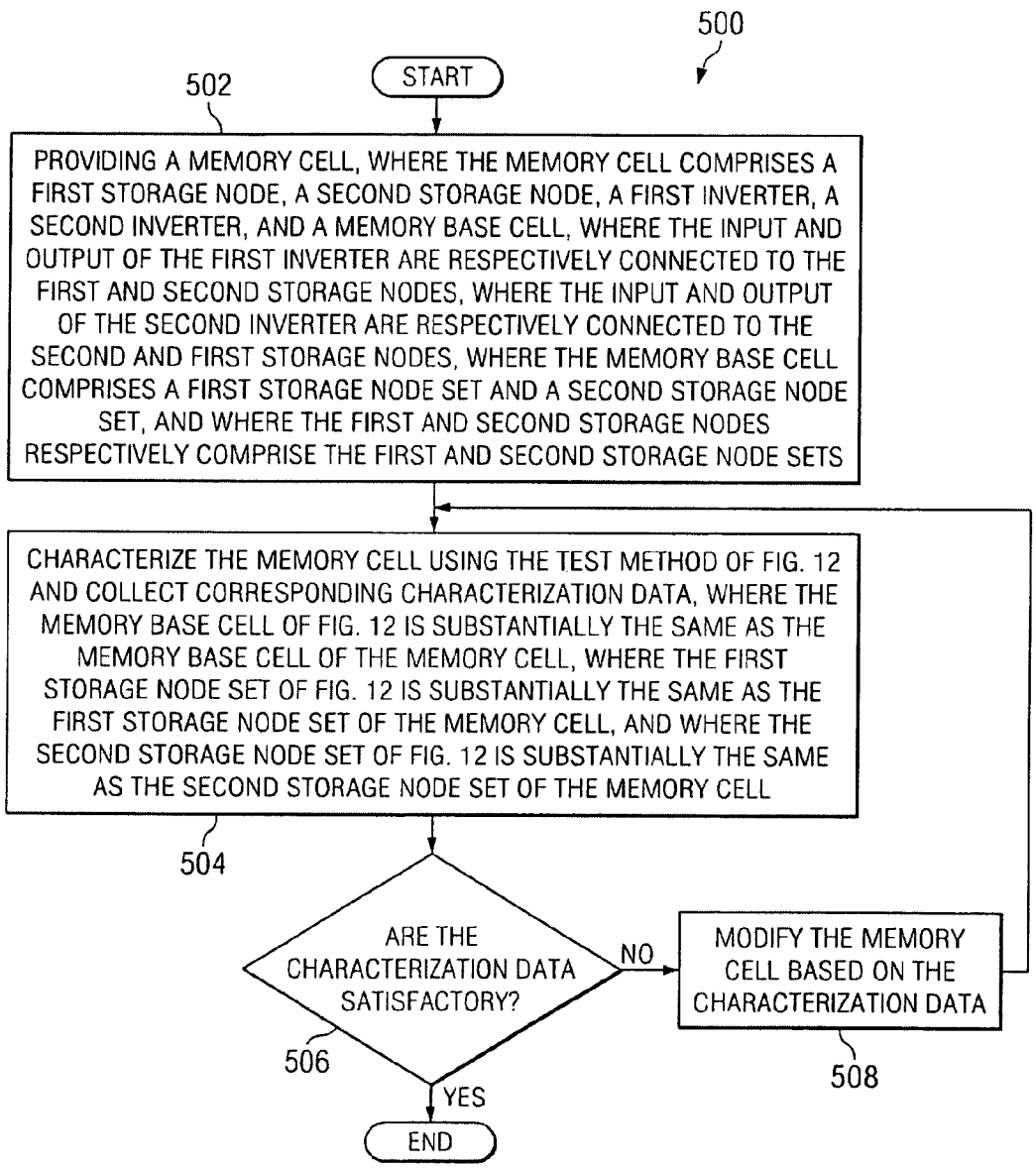
FIG. 18 is a flow chart illustrating a method of designing a memory cell according to the principles of the present invention.

FIG. 18 is a flow chart illustrating a method 500 of designing a memory cell according to the principles of the present invention. With this method, first a memory cell is provided at 502, where the memory cell comprises a first storage node, a second storage node, a first inverter, a second inverter, and a memory base cell, where the input and output of the first inverter are respectively connected to the first and second storage nodes, where the input and output of the second inverter are respectively connected to the second and first storage nodes, where the memory base cell comprises a first storage node set and a second storage node set, and where the first and second storage nodes respectively comprise the first and second storage node sets.

Then, the memory cell is characterized at 504 using the test method of FIG. 12 and the corresponding characterization data are collected, where the memory base cell of FIG. 12 is substantially the same as the memory base cell of the memory cell, where the first storage node set of FIG. 12 is substantially the same as the first storage node set of the memory cell, and where the second storage node set of FIG. 12 is substantially the same as the second storage node set of the memory cell.

If the characterization data are not satisfactory at 506, then modify the memory based on the characterization data at 508 and repeat the above steps for the modified memory cell at 504.

The foregoing description of the preferred embodiments has been presented for purposes of illustration and description. It is neither intended to be exhaustive nor to limit the invention to the precise form disclosed, and many modifications and variations are possible in light of the above teaching. The embodiments were chosen and described to best explain the principles of the invention and its practical applications thereby enable others skilled in the art to best utilize the invention in various embodiments and with various modifications as are suited to the particular use contemplated.

As an example, although the memory base cells described above use SAR layout configuration, it is also possible to use other layout configurations such as field scalable layout configuration.

As another example, although the two-storage-node-set memory base cells described above are based on a standard 6T SRAM cell, it is also possible for them to be based on one of other two-storage-node memory cells such as an SRAM cell, a content addressable memory (CAM) cell, and a latch cell, where the SRAM cell can be of other types such as being load-less, having 4T, 5T, 6T, 7T, 8T, 9T or 10T, being single sided, being dual port, two port, or multi-port, and/or having a column select line.

As yet another example, although the single-storage-node-set memory base cells described above are based on a 1T1C or 3T DRAM cell, it is also possible for them to be based on one of other single-storage-node memory cells such as a ferroelectric RAM (FRAM or FeRAM) cell.

As yet another example, although a specific sequence of steps are described in various methods, other sequence of steps are also possible.

It is intended that the scope of the invention be defined by the claims and their equivalents.

What is claimed is:

1. A test method comprising:
providing an integrated circuit, wherein said integrated circuit comprises a first memory base cell, wherein said first memory base cell comprises a first storage node set, a second storage node set, a set of other nodes, and a set of circuit elements each having a plurality of terminals, wherein said set of other nodes comprises a first data node for accessing said first storage node set, a first access control node for controlling the access of said first storage node set, a first supply node for supplying said first storage node set, and a second supply node for supplying said second storage node set, wherein said first and second supply nodes are of the same sinking or sourcing type;
conducting a circuit element test on a circuit element in said set of circuit elements, wherein in said circuit element test said first and second supply nodes are not connected together, each terminal of said circuit element is directly forced with an electrical quantity, and an electrical quantity is directly measured from a terminal of said circuit element; and
conducting a static noise margin test on said first memory base cell, wherein in said static noise margin test said first and second supply nodes are not connected together, wherein said static noise margin test comprises a first inverter transfer curve test and a second inverter transfer curve test, wherein in said first inverter transfer curve test all nodes in said second storage node set are connected together, a voltage is directly forced to all nodes in said first storage node set, and a voltage is directly measured from a node in said second storage node, and wherein in said second inverter transfer curve test all nodes in said first storage node set are connected together, a voltage is directly forced to all nodes in said second storage node set, and a voltage is directly measured from a node in said first storage node set.

2. The test method of claim 1, further comprising conducting a circuit element test on each circuit element in said set of circuit elements, wherein in each of said circuit element test on each circuit element said first and second supply nodes are not connected together, each terminal of said each circuit element is directly forced with an electrical quantity, and an electrical quantity is directly measured from a terminal of said each circuit element.

3. The test method of claim 1, further comprising a full cell test in which each node in said set of other nodes is forced with a voltage, all nodes in said first storage node set are connected together without being forced with an electrical quantity, all nodes in said second storage node set are connected together without being forced with an electrical quantity, and an electrical quantity is directly measured from said first data node, wherein the voltage on said first supply node and the voltage on said second supply node are substantially the same.

4. The test method of claim 1, wherein said integrated circuit further comprises a plurality of other memory base cells, wherein said first memory base cell and said plurality of other memory base cells together form an array having substantially the same configuration as a memory array, wherein each of said other memory base cells is substantially the same as said first memory base cell, wherein each of said other memory base cells is adjacent to said first memory base cell, and wherein at least one of the access control nodes in said other memory base cells and nodes in the storage node sets in said other memory base cells is forced with a voltage to cut off sneak path during a test.

5. An integrated circuit comprising a memory cell formed based on data collected from a characterization using the test method of claim 1.

6. The test method of claim 1, wherein said integrated circuit further comprises a first structure, wherein said first structure comprises said first memory base cell, a first port set, a second port set, and a set of other ports, wherein each node in said first storage node set is connected to a port in said first port set, wherein each node in said second storage node set is connected to a port in said second port set, wherein each of said other nodes is connected to one of said other ports, wherein each of said other ports is connected to one and only one of said other nodes.

7. The test method of claim 6, wherein said first and second supply nodes are of sinking type, and wherein said set of other nodes further comprises a first sourcing supply node for supplying said first storage node set and a second sourcing supply node for supplying said second storage node set.

8. The test method of claim 6, wherein said set of other nodes further comprises a second data node for accessing said second storage node set and a second access control node for controlling the access of said second storage node set.

9. The test method of claim 6, wherein said first memory base cell further comprises a first transistor having a first body terminal and a second transistor having a second body terminal, and wherein said set of other nodes further comprises a first body node and a second body node respectively connected to said first and second body terminals.

10. The test method of claim 6, further comprising a plurality of other structures each being selected from the group consisting of a probe pad, a bond pad, and a bump, wherein each port in said first port set, said second port set, and said set of other ports is connected to one of said other structures, and wherein each of said other structures is connected to one and only one port in said first port set, said second port set, and said set of other ports.

11. The test method of claim 6, wherein said first structure further comprises a plurality of other memory base cells and a third port set, wherein said first memory base cell and said plurality of other memory base cells together form an array having substantially the same configuration as a memory array, wherein each of said other memory base cells is substantially the same as said first memory base cell, wherein each of said other memory base cells is adjacent to said first memory base cell, and wherein at least one of the access control nodes in said other memory base cells and nodes in the storage node sets in said other memory base cells is connected to a port in said third port set.

12. The test method of claim 1, wherein said integrated circuit further comprises a first structure comprising said first memory base cell, a first port set, a second port set, and a set of other ports, wherein each node in said first storage node set is connected to a port in said first port set, wherein each node in said second storage node set is connected to a port in said second port set, wherein each of said other nodes is connected to one of said other ports, and wherein each of said other ports is connected to one and only one of said other nodes; and
a memory cell comprising a first storage node, a second storage node, a first inverter, a second inverter, and a second memory base cell, wherein the input and output of said first inverter are respectively connected to said first and second storage nodes, wherein the input and output of said second inverter are respectively connected to said second and first storage nodes, wherein said second memory base cell is substantially the same as said first memory base cell, wherein said second memory base cell comprises a third storage node set substantially the same as said first storage node set and a fourth storage node set substantially the same as said second storage node set, and wherein said first and second storage nodes respectively comprise said third and fourth storage node sets.

13. The test method of claim 12, wherein said first and second supply nodes are of sinking type, and wherein said set of other nodes further comprises a first sourcing supply node for supplying said first storage node set and a second sourcing supply node for supplying said second storage node set.

14. The test method of claim 12, wherein said set of other nodes further comprises a second data node for accessing said second storage node set and a second access control node for controlling the access of said second storage node set.

15. The test method of claim 12, wherein said first memory base cell further comprises a first transistor having a first body terminal and a second transistor having a second body terminal, and wherein said set of other nodes further comprises a first body node and a second body node respectively connected to said first and second body terminals.

16. The test method of claim 12, further comprising a plurality of other structures each being selected from the group consisting of a probe pad, a bond pad, and a bump, wherein each port in said first port set, said second port set, and said set of other ports is connected to one of said other structures, and wherein each of said other structures is connected to one and only one port in said first port set, said second port set, and said set of other ports.

17. The test method of claim 12, wherein said first structure further comprises a plurality of other memory base cells and a third port set, wherein said first memory base cell and said plurality of other memory base cells together form an array having substantially the same configuration as a memory array, wherein each of said other memory base cells is substantially the same as said first memory base cell, wherein each of said other memory base cells is adjacent to said first memory base cell, and wherein at least one of the access control nodes in said other memory base cells and nodes in the storage node sets in said other memory base cells is connected to a port in said third port set.

18. The test method of claim 12, wherein said first structure further comprises a third memory base cell substantially the same as said first memory base cell, wherein each node in said first storage node set, said second storage node set, and said set of other nodes is connected to the corresponding node in said third memory base cell.

19. The test method of claim 12, further comprising a second structure selected from the group consisting of an on-chip parametric measurement structure and a multiplexed structure, wherein said second structure comprises said first structure.

20. The test method of claim 12, wherein said first memory base cell is substantially the same as said memory cell up through a layer selected from the group consisting of a gate layer, a contact layer, and a metal 1 layer.

21. The test method of claim 12, wherein said first structure is in scribe line.

22. A method of designing a memory cell, comprising:
providing a first memory cell, wherein said first memory cell comprises a first storage node, a second storage node, a first inverter, a second inverter, and a first memory base cell, wherein the input and output of said first inverter are respectively connected to said first and second storage nodes, wherein the input and output of said second inverter are respectively connected to said second and first storage nodes, wherein said first memory base cell comprises a first storage node set and a second storage node set, and wherein said first and second storage nodes respectively comprise said first and second storage node sets;

providing an integrated circuit, wherein said integrated circuit comprises a second memory base cell substantially the same as said first memory base cell, wherein said second memory base cell comprises a third storage node set substantially the same as said first storage node set, a fourth storage node set substantially the same as said second storage node set, a set of other nodes, and a plurality of circuit elements each having a plurality of terminals, wherein said set of other nodes comprises a first data node for accessing said third storage node set, a first access control node for controlling the access of said third storage node set, a first supply node for supplying said third storage node set, and a second supply node for supplying said fourth storage node set, wherein said first and second supply nodes are of the same sinking or sourcing type;

conducting a circuit element test on a circuit element in said set of circuit elements, wherein in said circuit element test said first and second supply nodes are not connected together, each terminal of said circuit element is directly forced with an electrical quantity, and an electrical quantity is directly measured from a terminal of said circuit element;

conducting a static noise margin test on said first memory base cell, wherein in said static noise margin test said first and second supply nodes are not connected together, wherein said static noise margin test comprises a first inverter transfer curve test and a second inverter transfer curve test, wherein in said first inverter transfer curve test all nodes in said second storage node set are connected together, a voltage is directly forced to all nodes in said first storage node set, and a voltage is directly measured from a node in said second storage node, and wherein in said second inverter transfer curve test all nodes in said first storage node set are connected together, a voltage is directly forced to all nodes in said second storage node set, and a voltage is directly measured from a node in said first storage node set; and designing a second memory cell based on data collected from said circuit element test and said static noise margin test.

\* \* \* \* \*